United States Patent
Tan et al.

(10) Patent No.: US 11,614,499 B2
(45) Date of Patent: Mar. 28, 2023

(54) METHODS AND APPARATUS TO IMPROVE DETECTION OF CAPACITORS IMPLEMENTED FOR REGULATORS

(71) Applicant: Texas Instruments Incorporated, Dallas, TX (US)

(72) Inventors: Siang Tong Tan, Dallas, TX (US); Gangqiang Zhang, Plano, TX (US); Angelo William Pereira, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 191 days.

(21) Appl. No.: 17/133,378

(22) Filed: Dec. 23, 2020

(65) Prior Publication Data
US 2022/0206084 A1  Jun. 30, 2022

(51) Int. Cl.
| G05F 1/575 | (2006.01) |
| G01R 31/01 | (2020.01) |
| G01R 31/64 | (2020.01) |
| H03K 3/037 | (2006.01) |
| H03K 19/20 | (2006.01) |
| G05F 1/56 | (2006.01) |

(52) U.S. Cl.
CPC ........... *G01R 31/64* (2020.01); *G01R 31/016* (2013.01); *G05F 1/56* (2013.01); *G05F 1/575* (2013.01); *H03K 3/037* (2013.01); *H03K 19/20* (2013.01)

(58) Field of Classification Search
CPC ......... G01R 31/016; G01R 31/64; G05F 1/56; G05F 1/565; G05F 1/569; G05F 1/575
See application file for complete search history.

(56) References Cited

U.S. PATENT DOCUMENTS

| 8,179,156 B2* | 5/2012 | Horsky | G01R 31/64 324/764.01 |
| 10,203,710 B2* | 2/2019 | Bhattad | G05F 1/575 |
| 10,496,114 B2* | 12/2019 | Mouret | G05F 1/46 |
| 2021/0091562 A1* | 3/2021 | Wong | H02H 9/046 |

FOREIGN PATENT DOCUMENTS

CN 104750155 7/2015

OTHER PUBLICATIONS

Texas Instruments, "TPS653850-Q1 Multirail Power Supply for Microcontrollers in Safety-Relevant Applications," Feb. 2021, 12 pages.

* cited by examiner

*Primary Examiner* — Patrick O Neill
(74) *Attorney, Agent, or Firm* — Ray A. King; Frank D. Cimino

(57) ABSTRACT

An apparatus includes a resistor having a resistor terminal. The apparatus includes a capacitor coupled to the resistor terminal. The apparatus includes a transistor having a current terminal and a gate. The gate is coupled to the resistor terminal and coupled to the capacitor. The apparatus includes a comparator having a comparator input and a comparator output. The comparator input is coupled to the current terminal. The apparatus includes a latch having a latch input coupled to the comparator output.

20 Claims, 10 Drawing Sheets

| | | 221 | 223 | 128 |
|---|---|---|---|---|
| | CONDITION | DETRISE NODE | DETFALL NODE | DETECTION NODE |
| 902 | NO EXTERNAL CAP | 1 | 0 | 0 |
| 904 | WITH EXTERNAL CAP | 0 | 1 | 1 |
| 906 | LARGE EXTERNAL CAP WITH INITIAL CHARGE < Vth OF 214 | 0 | 0 | 1 |
| 908 | LARGE EXTERNAL CAP WITH INITIAL CHARGE > Vth OF 214 | 1 | 1 | 1 |

METHODS AND APPARATUS TO IMPROVE DETECTION OF CAPACITORS IMPLEMENTED FOR REGULATORS

TECHNICAL FIELD

This description relates generally to buffering, and more particularly to methods and apparatus to improve detection of capacitors implemented for regulators.

BACKGROUND

Regulators, such as voltage regulators, receive an unregulated input voltage signal and provide a substantially constant voltage. In other words, the voltage regulator regulates the input signal so that it can be used by other devices (e.g., mobile phones, music players, voltage sensitive devices, computers, etc.). The stabilized output voltage provides less noise and distortion for devices connected to the voltage regulator.

SUMMARY

An apparatus includes a resistor having a resistor terminal. The apparatus includes a capacitor coupled to the terminal. The apparatus includes a transistor having a current terminal and a gate. The gate is coupled to the resistor terminal and coupled to the capacitor. The apparatus includes a comparator having a comparator input and a comparator output. The comparator input is coupled to the current terminal. The apparatus includes a latch having a latch input coupled to the comparator output.

DETAILED DESCRIPTION

Figure 1:
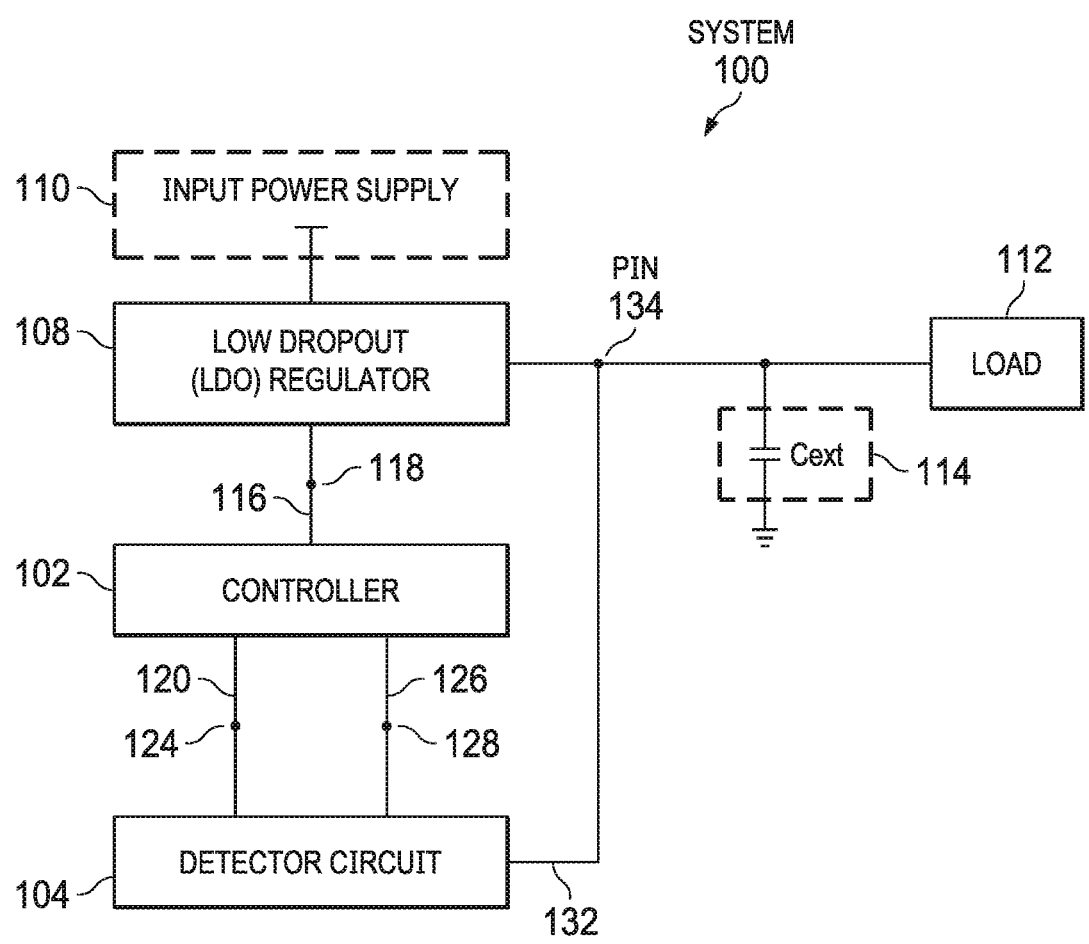
FIG. 1 is a block diagram of an example system including an example detector circuit to detect a capacitor.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Various forms of the term "couple" are used in this description. These terms may cover connections, communications or signal paths that enable a functional relationship consistent with this description. For example, if device A generates a signal to control device B to perform an action, then: (a) in a first example device, A is coupled to device B by direct connection; or (b) in a second example device, A is coupled to device B through intervening component C if intervening component C does not alter the functional relationship between device A and device B, such that device B is controlled by device A via the control signal generated by device A.

In this description, the term "configured to" may encompass being configurable, but it does not require being configurable. Certain features described herein in the context of separate embodiments can also be implemented in combination in a single embodiment. Conversely, various features described herein in the context of a single embodiment can also be implemented in multiple embodiments separately or in any suitable subcombination.

Even if the drawings show operations performed in an example particular order, such operations are not required be performed in the example particular order or in sequential order, and some illustrated operations may be optional. In certain circumstances, multitasking and parallel processing may be advantageous.

A Low Dropout Regulator (LDO) is a voltage regulator that regulates the output voltage even when the supply voltage (e.g., the input voltage) is within a close range to the output voltage. For example, voltage regulators usually require a large voltage drop between the input and output to operate properly. Therefore, voltage regulators generally require a relatively high-voltage input power supply to operate properly. However, an LDO regulator can operate correctly (e.g., regulate the output voltage) even when the input power supply is low-voltage (e.g., within a close range to the output voltage). In some examples, in order to correctly regulate the output voltage and maintain a stable output voltage, the LDO regulator is configured with a frequency compensated feedback loop.

A common approach to frequency compensation in LDO regulator feedback loops is outfitting the LDO regulator with an output capacitor changes occur. Also, the output capacitor is used as a power supply decoupling capacitor to suppress high-frequency noise output by the input power supply. To compensate the frequency of the feedback loop (e.g., to stabilize the feedback loop) and to suppress high-frequency noise provided by the power supply, the LDO regulator output capacitor is designed within a certain range of capacitance. The particular value of capacitance ranges based on load current, headroom available, etc.

In some examples, if an LDO regulator is turned on (e.g., enabled) without the output capacitor or without the correct capacitance of the output capacitor, the LDO regulator output is likely to oscillate with a large voltage swing. For example, if the capacitance of the output capacitor is too small or too large, then the output of the LDO regulator will not be stabilized (e.g., the output voltage will oscillate). An oscillating output can damage the circuitries (e.g., the loads) powered by the LDO regulator and, in some examples, also damage the LDO regulator itself. In other examples, the LDO regulator may not be outfitted with an output capacitor, which causes instability responsive to high load currents, sudden changes in power supply, etc. The output capacitor may be considered "missing" from the LDO regulator output if the output capacitor was never installed, if the output capacitor has been damaged, etc. In such an example, if the LDO regulator is turned on and the output capacitor is "missing," the LDO regulator output is likely to oscillate. Detecting the absence of a valid capacitor and/or a capacitor in the permitted range avoids system damage, such as in the case of an automotive ECU (Electronic Control Unit). For example, if a regulator self-detects the absence of a valid capacitor or a capacitor out of range, the regulator determines not to power up and instead to assert appropriate safety signals to the ECU microcontroller.

Output capacitor detector circuits are designed to detect if an LDO regulator includes an output capacitor to avoid oscillation at the output of the LDO regulator. The output capacitor detector circuit usually requires a reference voltage, an accurate timer, and a clock signal to accurately detect the output capacitor. The need for a reference voltage implies the need for an additional circuit, such as a bandgap reference, which in turn, requires a stable supply. While such a reference circuit may exist on chip, enabling a reference would result in additional power consumption during detection, which could be avoided with examples described herein. Further, the requirement of a timer or clock signal in a conventional detector circuit prevents the usage of the detector circuit in regulators that do not otherwise have a clock generator on chip, such as an oscillator. This is a limitation for regulators that are powered on before the oscillator on chip (e.g., an "always-on LDO"). The limitation also implies the need for logic sequence and a digital control of the detection. The need for logic and digital control implies that an active digital controller must be powered and available before the regulator is active. Therefore, the requirement of a timer or clock is limiting in general and limiting in low cost applications. The detection of the output capacitor depends on the accuracy of these features (e.g., reference voltage, timer, and clock signal), which are subject to variation throughout the life of the output capacitor detector. In this manner, such output capacitor detector circuits may need to increase complexity and/or area to reduce such variation and hence are more expensive.

In examples described herein, the examples relate to LDO regulators adapted to be coupled to an external output capacitor. In examples described herein, an external output capacitor is external to the die of the LDO regulator. Examples described herein include a capacitor detector circuit to detect whether the external output capacitor exists and/or is properly operating within the specifications of the LDO regulator. The detection of the external output capacitor in examples described herein does not depend on a timer, a clock signal, or a reference voltage.

For example, the capacitor detector circuit includes two charging circuits, where a first charging circuit includes a first resistor (R1) and is coupled to the external output capacitor (Cext) (e.g., the output of the LDO regulator) and the second charging circuit includes a second resistor (R2) coupled to a reference internal capacitor (Cint). The charging circuits of the capacitor detector circuit are used to charge the capacitors (e.g., the external capacitor and the reference capacitor) and compare the relative voltage ramp rate between the two capacitors during charging. In examples described herein, the term "charging" corresponds to applying voltage and current to an electric component, such as a capacitor, so that the electric component stores energy during charging, the voltage across the capacitor increases, generating a voltage ramp. The slope of the voltage ramp indicates how fast the capacitor is charging and, thus, how big or small the capacitor is. For example, the bigger the capacitor, the longer it takes to charge the capacitor. By comparing the voltage ramp rate between the external output capacitor and the reference capacitor, a logic circuit of the capacitor detector circuit determines whether the external output capacitor has been detected or not detected. Therefore, the detection of the external output capacitor depends only on the reference capacitor in the second charging circuit.

In examples described herein, the capacitor detector circuit is activated before the LDO regulator is powered. The capacitor detector circuit provides a detection signal to the controller that is indicative of a status of the external output capacitor. In this manner, the controller can determine if the LDO regulator should be enabled based on the detection signal from the capacitor detector circuit.

FIG. 1 is a block diagram of an example system 100. In FIG. 1, the system 100 includes an example controller 102, an example capacitor detector circuit 104, an example low dropout (LDO) regulator 108, an example input power supply 110, and an example load 112. In some examples, the system 100 includes an external capacitor 114. The system 100 is a device that manages power provided to the load 112. The device may be a part of any type of computing system and/or non-computing system such as a subsystem of mobile phone, a laptop, a speaker, a television, etc. The system 100 may include additional parts not illustrated herein.

In FIG. 1, the system 100 includes the controller 102 to control the enabling of the detector circuit 104 and the LDO regulator 108. The controller 102 includes a first output terminal 116 coupled to the LDO regulator 108 at a first control node 118, a second output terminal 120 coupled to the detector circuit 104 at a second control node 124, and an input terminal 126 coupled to the detector circuit 104 at a DETECTION node 128. The controller 102 sends control signals, via the respective output terminals 116, 120, to enable and/or disable the detector circuit 104 and the LDO regulator 108. In some examples, the controller 102 is an analog circuit. In other examples, the controller 102 is a logic circuit, a state machine, and/or any other type of processor/device that can send control signals to the detector circuit 104 and the LDO regulator 108.

In FIG. 1, the system 100 includes the detector circuit 104 to detect a connection of the external capacitor 114. For example, the detector circuit 104 determines if the external capacitor 114 is operating properly (e.g., not damaged) and/or if the external capacitor 114 is disconnected. The detector circuit 104 includes an input terminal coupled to the output terminal 120 of the controller 102 at the second control node 124, a PIN terminal 132 coupled to an output of the LDO regulator 108 at PIN node 134, and an output terminal coupled to the controller 102 at the DETECTION node 128. The detector circuit 104 is coupled to the controller 102 for receiving enable and disable signals. In some examples, the detector circuit 104 turns on and off responsive to control signals (e.g., enable and disable signals) from the controller 102. The detector circuit 104 is described in further detail below in connection with FIG. 2.

In FIG. 1, the system 100 includes the LDO regulator 108 to regulate voltage, supplied by the input power supply 110, for use by the load 112. For example, the LDO regulator 108 reduces voltage to a reference level that is useful to drive the load 112. In some examples, the LDO regulator 108 regulates voltage at the output independent of load impedance, input-voltage variations, temperature, and time. The LDO regulator 108 includes an input terminal that is coupled to the controller 102 at the first control node 118 and an output terminal coupled to the load 112 at the PIN node 134. In some examples, the output terminal of the LDO regulator 108 is coupled to the external capacitor 114 at the PIN node 134.

In FIG. 1, the system 100 includes the input power supply 110 to supply power to the load 112. The input power supply 110 may be any regulated, switched, and/or battery power supply. The input power supply 110 may generate supply voltages that are too high for the load 112 and, thus, would damage the load 112. In this manner, the input power supply 110 is coupled to the LDO regulator 108 for regulating the high voltages.

In FIG. 1, the system 100 includes the load 112 to draw power from the input power supply 110 via the LDO regulator 108. The load 112 includes an input terminal coupled to the output terminal of the LDO regulator at the PIN node 134. In some examples, the input terminal of the load 112 is coupled to the external capacitor 114 at PIN node 134. The load 112 may be a processor, a transceiver, a microcontroller, and/or any type of circuit performing an action for the system 100.

Multiple instances of system 100 of FIG. 1 may be included in an application to regulate power to multiple loads. For example, a laptop includes loads such as speakers, microphones, cameras, calculators, touch screens, displays, keypads, etc. Each of the loads in the computer may include a separate LDO regulator that regulates supply voltage based on the loads' specifications.

In an example operation of the system 100, the controller 102 may be pre-programmed to perform a capacitor detection program at a specific time. For example, the controller 102 may be configured to execute the capacitor detection program at a time before the load 112 is powered. In other examples, the controller 102 obtains a notification from a user of the system 100 indicative to execute the capacitor detection program. In examples herein, the capacitor detection program is initiated before the regulator 108 is powered up, because turning on a regulator with a capacitor fault detected on the output node is not desirable.

The controller 102, responsive to the timing and/or the notification, generates a first control signal configured to cause the LDO regulator 108 to enter a high impedance state (e.g., a Hi-Z state). For example, the controller 102 sends a control signal to the LDO regulator 108 via the first control node 118 that causes the LDO regulator 108 to open a switch between the input power supply 110 and the output terminal of the LDO regulator 108 so that the output signal of the LDO regulator 108 at PIN node 134 is not determined by the LDO regulator 108. The output signal at PIN node 134 is left open so that the detector circuit 104 can drive and/or determine the signal at PIN node 134.

The controller 102, responsive to the LDO regulator 108 entering the Hi-Z state, initiates the detector circuit 104 by sending a second control signal to the detector circuit 104. The controller 102 generates the second control signal that is configured to turn on the detector circuit 104 to begin the process of detecting the external capacitor 114.

The detector circuit 104 detects whether the external capacitor 114 is connected or disconnected (e.g., present or missing) responsive to the supply voltage. The detector circuit 104 provides a detection signal, indicative of the status of the external capacitor 114 (e.g., connected, disconnected, operating within or outside a known range, etc.) to the controller 102 via the DETECTION node 128.

The controller 102 makes a decision to turn on the LDO regulator 108 responsive to the detection signal at the DETECTION node 128. For example, if the detection signal is indicative that the external capacitor 114 is connected, the controller 102 initiates the LDO regulator 108. In other examples, if the detection signal is indicative that the external capacitor 114 is disconnected, the controller 102 does not initiate the LDO regulator 108 and may flag the LDO regulator 108 as not coupled to an external cap and/or notify an operator of the non-operating external capacitor 114. For example, if the external capacitor 114 is not operating, the LDO regulator 108 and the load 112 are subject to damage due to voltage oscillation at PIN node 134.

Figure 2:
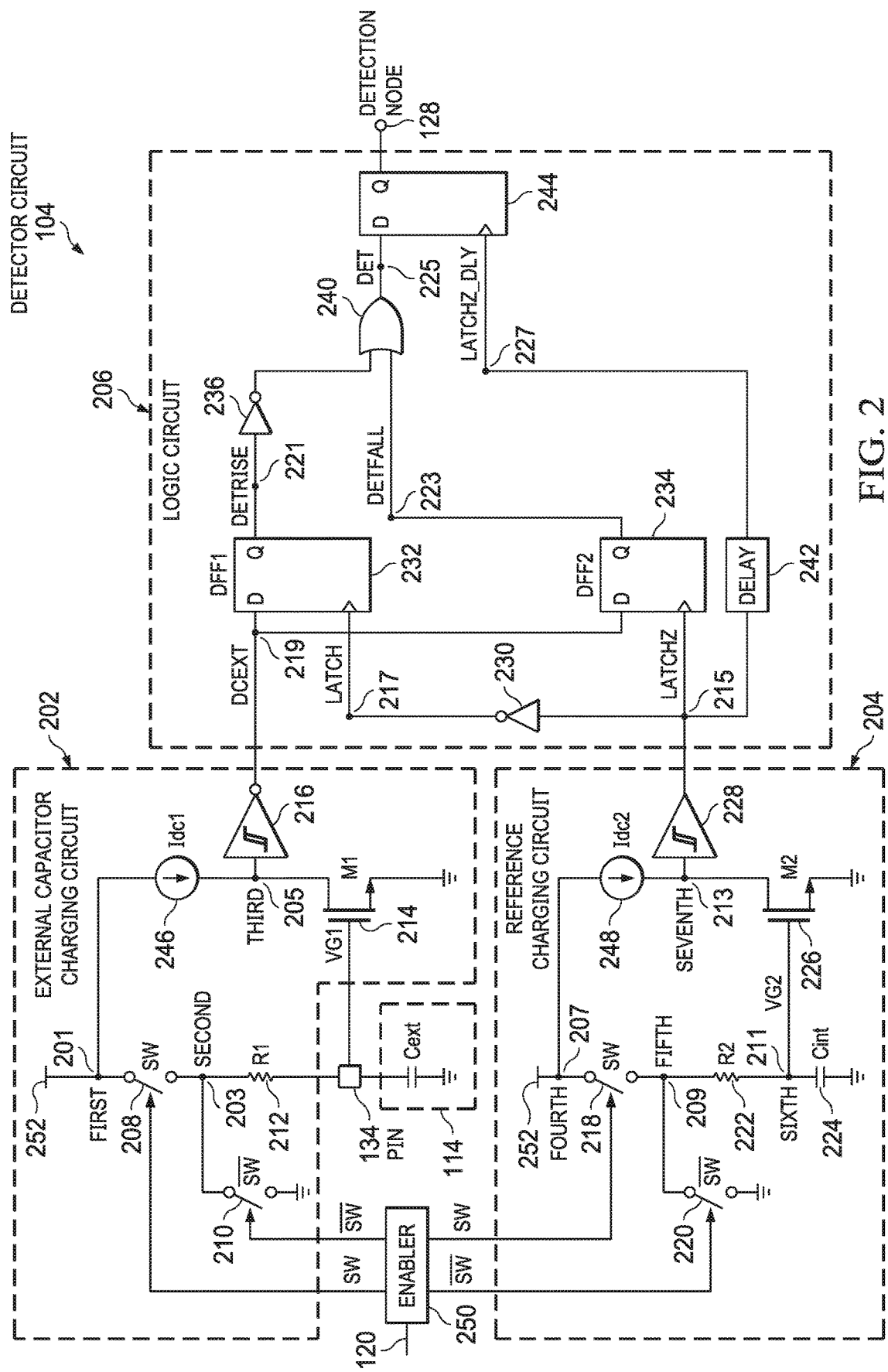
FIG. 2 is a schematic diagram of the detector circuit of FIG. 1 to detect the capacitor.

FIG. 2 is a schematic diagram of the detector circuit 104 of FIG. 1. The detector circuit 104 of FIG. 2 includes an example external capacitor charging circuit 202, an example reference charging circuit 204, and an example logic circuit 206. The external capacitor charging circuit 202 of FIG. 2 includes an example first switch 208, an example second switch 210, an example first resistor 212, an example first transistor 214, an example first comparator 216, and an example first current source 246. The example reference charging circuit 204 includes an example third switch 218, an example fourth switch 220, an example second resistor 222, an example internal capacitor 224 ($C_{int}$), an example second transistor 226, an example second comparator 228, and an example second current source 248. The logic circuit 206 includes an example first logic gate 230, an example first latch (DFF1) 232, an example second latch (DFF2) 234, an example second logic gate 236, an example third logic gate 240, an example delay logic 242, and an example third latch (DFF3) 244. The detector circuit 104 of FIG. 2 includes an example enabler 250.

In FIG. 2, the first transistor 214 and the second transistor 226 are N-channel metal-oxide-semiconductor field-effect transistors (MOSFETs) (e.g., N-channel silicon MOSFETs, N-channel gallium nitride (GaN) MOSFETs, etc.). Alternatively, the first transistor 214 and the second transistor 226 may be implemented by P-channel metal-oxide-semiconductor field-effect transistors (MOSFETs), bipolar junction transistors (BJTs), and/or any other type of transistor by reconfiguring the components of the detector circuit 104 of FIG. 2.

In the example of FIG. 2, the first switch 208, the second switch 210, the third switch 218, and the fourth switch 220 are solid state switches. For example, the first switch 208, the second switch 210, the third switch 218, and the fourth switch 220 may be any type of solid state switches such as transistors, MOSFETs, Insulated Gate Bipolar Transistors (IGBTs), Silicon Controlled Rectifiers (SCRs), Gate Turn-Off Thyristors (GTOs), etc.

In the example of FIG. 2, the first comparator 216 and the second comparator 228 are Schmitt triggers. Additionally and/or alternatively, the first comparator 216 and the second comparator 228 may be any type of comparator. In FIG. 2, the first comparator 216 is an inverting comparator. In some examples, the first comparator 216 is an inverting Schmitt trigger.

In FIG. 2, the first logic gate 230, the second logic gate 236, and the third logic gate 240 are logic gates. In this example of FIG. 2, the first logic gate 230 and the second logic gate 236 are inverters (e.g., inverting logic gates, an inverter logic gates, etc.) and the third logic gate 240 is an OR gate (e.g., an OR logic gate, a logic OR gate, etc.).

In FIG. 2, the first latch 232, the second latch 234, and the third latch 244 are implemented by D-type flip-flops. Additionally and/or alternatively, the first latch 232, the second latch 234, and the third latch 244 may be implemented by set/reset (SR) latches, JK-type flip-flops, T-type flip-flops, and/or any type of basic latch and/or flip-flop.

The external capacitor charging circuit 202 includes the first resistor 212 which is coupled to the output of the LDO regulator 108 and adapted to be coupled to the external capacitor 114 at PIN node 134. The first resistor 212 and the external capacitor 114 form a first RC network configured to charge and discharge during detection. The reference charging circuit 204 includes the second resistor 222 and the internal capacitor 224 to form a second RC network configured to charge and discharge during detection.

The enabler 250 is coupled to the output terminal 120 of the controller 102 at the second control node 124. The enabler 250 generates a detection logic sequence responsive to receiving a detection initiation from the controller 102. The enabler 250 provides the detection logic sequence to the first switch 208, the second switch 210, the third switch 218, and the fourth switch 220. In FIG. 2, the enabler includes four outputs, two of which correspond to a switch (SW) sequence and two of which correspond to a switch not ($\overline{SW}$) sequence. The two outputs corresponding to the SW sequence are output to the first switch 208 and the third switch 218. The other two outputs corresponding to the $\overline{SW}$ sequence are provided to the second switch 210 and the fourth switch 220. In this manner, the first switch 208 and the third switch 218 obtain the same logic signal and the second switch 210 and the fourth switch 220 obtain the same logic signal, opposite (e.g., inverted) from the SW sequence logic signal.

In the external capacitor charging circuit 202, the first switch 208 includes a first switch terminal and a second switch terminal, the second switch 210 includes a first switch terminal and a second switch terminal, the first resistor 212 includes a first terminal and a second terminal, the first transistor 214 includes a gate terminal, a first current terminal (e.g., drain terminal), and a second current terminal (e.g., source terminal), and the first comparator 216 includes an input terminal and an output terminal. The first switch terminal of the first switch 208 is coupled to a supply 252 at a first node 201. The input terminal of the first comparator 216 is coupled to an output of the current source ($I_{dc1}$) 246 at a third node 205. The first current source 246 is coupled to the supply 252 at the first node 201. The second switch terminal of the first switch 208 is coupled to a first terminal of the first resistor 212 at a second node 203 and coupled to the first switch terminal of the second switch 210 at the second node 203. The second terminal of the first resistor 212 is coupled to the output of the LDO regulator 108 of FIG. 1 at PIN node 134. In some examples, the second terminal of the first resistor 212 is coupled to a first terminal of the external capacitor 114 of FIG. 1 at the PIN node 134. The gate terminal of the first transistor 214 is coupled to the output of the LDO regulator 108 of FIG. 1 at PIN node 134 and the second terminal of the first resistor 212 at PIN node 134. In some examples, the gate terminal of the first transistor 214 is coupled to the first terminal of the external capacitor 114. The first current terminal of the first transistor 214 is coupled to the input terminal of the first comparator 216 at the third node 205.

In the reference charging circuit 204, the third switch 218 includes a first switch terminal and a second switch terminal, the fourth switch 220 includes a first switch terminal and a second switch terminal, the second resistor 222 includes a first terminal and a second terminal, the internal capacitor 224 includes a first terminal and a second terminal, and the second transistor 226 includes a gate terminal, a first current terminal (e.g., drain terminal), and a second current terminal (e.g., source terminal). The first switch terminal of the third switch 218 is coupled to the supply 252 at a fourth node 207. The input terminal of the second comparator 228 is coupled to an output of the second current source ($I_{dc2}$) 248 at a seventh node 213. The second current source 248 is coupled to the supply 252 at the fourth node 207. The second switch terminal of the third switch 218 is coupled to the first terminal of the second resistor 222 at a fifth node 209 and coupled to the first switch terminal of the fourth switch 220 at the fifth node 209. The second terminal of the second resistor 222 is coupled to the first terminal of the internal capacitor 224 at a sixth node 211 and coupled to the gate terminal of the second transistor 226 at the sixth node 211. The first current terminal of the second transistor 226 is coupled to the input terminal of the second comparator 228 at the seventh node 213.

The logic circuit 206 includes the logic gates 230, 236, 240 and the latches 232, 234, 244 to comparing a speed of the charge and discharge rate of the first RC network in the external capacitor charging circuit 202 to a speed of the charge and discharge rate of the second RC network in the reference charging circuit 204. The logic circuit 206 includes the third latch 244 to provide a status of the external capacitor 114 based on the comparison of the charge and discharge rates of the two RC networks. The status of the external capacitor 114 is indicative of the connection of the external capacitor 114 at the output of the LDO regulator 108. For example, the status determines whether the external capacitor 114 is connected to the output of the LDO regulator 108 or whether the external capacitor 114 is disconnected and/or operating abnormally.

In the logic circuit 206, the first logic gate 230 includes an input terminal and an output terminal, the first latch 232 includes a clock input, a data pin input, and an output, the second latch 234 includes a clock input, a data pin input, and an output, the second logic gate 236 includes an input terminal and an output terminal, the third logic gate 240 includes a first input terminal, a second input terminal, and an output terminal, the delay logic 242 includes an input and an output, and the third latch 244 includes a clock input, a data pin input, and an output.

In the logic circuit 206, the output terminal of the second comparator 228 is coupled to the input terminal of the first logic gate 230 at a latchz node 215, coupled to the clock input of the second latch 234 at the latchz node 215, and coupled to the delay logic 242 at the latchz node 215. The output terminal of the first logic gate 230 is coupled to the clock input of the first latch 232 at a latch node 217. The output terminal of the first comparator 216 is coupled to the data pin of the first latch 232 at an external capacitor detection (DCEXT) node 219 and coupled to the data pin of the second latch 234 at the DCEXT node 219. The output terminal of the first latch 232 is coupled to the input terminal of the second logic gate 236 at a detection rise (DETRISE) node 221. The output terminal of the second logic gate 236 is coupled to the first input of the third logic gate 240. The output terminal of the second latch 234 is coupled to the second input terminal of the third logic gate 240 at a detection fall (DETFALL) node 223. The output terminal of the third logic gate 240 is coupled to the data pin of the third latch 244 at a detection (DET) node 225. The delay logic 242 is coupled to the clock input of the third latch 244 at a LATCHZ_DLY node 227. The output of the third latch 244 is coupled to the controller 102 of FIG. 1 at the DETECTION node 128.

In an example first operation of the detector circuit 104, the external capacitor 114 is present in the system 100 and operating properly. In the example first operation, the enabler 250 provides the detection logic sequence that enables the first switch 208 and the third switch 218 (e.g., go high, etc.) and disables the second switch 210 and fourth switch 220 responsive to a control signal from the controller 102. For example, the enabler 250 initiates and terminates the detection process using a single pulse (e.g., the detection logic sequence). The rising edge of the pulse triggers the signal at the second node 203 to go high (e.g., SW=logic 1). The falling edge of the pulse triggers the signal at the second node 203 to go low (e.g., SW=logic 0). When the first switch 208 and third switch 218 are closed (e.g., SW=1), the signal at the DETRISE node 221 is obtained by the third logic gate 240. When first switch 208 and the second switch 210 are open (e.g., SW=0), the signal at the DETFALL node 223 is obtained by the third logic gate 240. Together, the results of the pulses are combined to obtain the final result at the DETECTION node 128. The width of the detection logic sequence (e.g., the SW pulse and the $\overline{SW}$ pulse) is to enable reliable detection of the presence or absence of the external capacitor 114.

In some examples, the first RC network comprising the first resistor 212 and the external capacitor 114 begin to charge responsive to the first switch 208 turning on. The charging of the first RC network generates the first voltage (VG1). The voltage at the external capacitor 114 ramps up at a rate determined by an RC time constant.

Simultaneously, the second RC network comprising the second resistor 222 and the internal capacitor 224 begins to charge responsive to the third switch 218 turning on. The charging of the second RC network generates the second voltage (VG2). The voltage at the internal capacitor 224 ramps up at a rate determined by the RC time constant. In some examples, the ramp rate is exponential. In examples herein, the ramp rate of VG2 is approximately linear. The internal capacitor 224 is designed to be a capacitance equal to $C_{EXT}/N$, where N is greater than 1 so that the capacitance of the internal capacitor 224 on the integrated circuit (e.g., the integrated circuit being the detector circuit 104) is small enough to be fabricated with very low area. The choice of the capacitance of the internal capacitor 224 is such that for a minimum acceptable value of the external capacitor 114, the VG2 voltage always rises and falls at a faster rate than the VG1 voltage. In some examples, the first resistor 212 and the second resistor 222 may be implemented with the same unit resistors to achieve the best matching of the charging or discharging current values in the two resistors.

When the second voltage VG2 ramps above a threshold voltage (Vth) of the second transistor 226, the second transistor 226 turns on. The first current terminal (e.g., the drain terminal) of the second transistor 226 is coupled to a current source (Idc2) and coupled to the input terminal of the second comparator 228. Thus, when the second transistor 226 turns on, responsive to the VG2 ramping above the threshold voltage (Vth), the second transistor 226 sinks the current from the current source (Idc2). When the second transistor 226 sinks current, the signal at the seventh node 213 goes low. For example, the signal at the seventh node 213 goes from high to low responsive to the second transistor 226 turning on.

In some examples, when the signal at the seventh node 213 goes low, the signal at the output of the second comparator 228 also goes low. For example, the signal at latchz node 215 goes low. In this example, the second comparator 228 is a Schmitt trigger and removes the noise of the signal at the seventh node 213, thus causing the signal at the latchz node 215 to be a logic high (1) or a logic low (0).

In some examples, when the signal at the latchz node 215 goes low, the first logic gate 230 provides a high signal at the latch node 217. The first logic gate 230 inverts the input signal (low) at the output (high). As such, the signal at the latch node 217 is high responsive to the second transistor 226 turning on.

In some examples, the first latch 232 latches the signal at the DCEXT node 219 when the signal at the latch node 217 goes high. The clock input of the first latch 232 is configured to receive the signal at the latch node 217. When the input signal to the clock input of the first latch 232 goes high, the first latch 232 latches the logic value of the signal at the data pin input, which is configured to receive the signal at the DCEXT node 219. The first latch 232 provides the signal at the DCEXT node 219 responsive to the signal at the latch node 217 going high. The latched value of DCEXT node 219 is presented on first latch output 232 pin Q, coupled to the signal DETRISE node 221.

The signal at the DCEXT node 219 depends on the ramp rate of the first voltage VG1. The voltage ramp rate of VG1 depends on the capacitance of the external capacitor 114. In some examples, the size of the external capacitor 114 is greater than the size of the internal capacitor 224 multiplied by a resistor ratio of the first and second resistor 212, 222 and, thus, the voltage ramp rate of VG1 is slower than the voltage ramp rate of VG2. When the voltage VG1 increases above the threshold voltage (Vth) of the first transistor 214, the first transistor 214 turns on.

The first current terminal (e.g., the drain terminal) of the first transistor 214 is coupled to the output of the first current source (Idc1) 246 and to the input terminal of the first comparator 216 at the third node 205. The signal at the third node 205 goes low responsive to the first transistor 214 turning on.

The first comparator 216 is an inverting Schmitt trigger that removes the noise of the low signal at the third node 205 and inverts the input signal at the output to be high.

When VG1 ramps slower than VG2, the first latch 232 latches a logic low (0) signal at DCEXT node 219, because the clock input coupled to the LATCHZ node 217 has a rising edge before the signal at DCEXT node 219 has changed state from low to high. The signal at DCEXT node 219 is a logic low until the first transistor 214 turns on responsive to VG1 ramping to a voltage that exceeds the threshold voltage (Vth) of the first transistor 214. In such an example, the signal at the DETRISE node 221 is a logic low, regardless if the signal at the DCEXT node 219 goes high (1).

The enabler 250 applies a charging (or ramping up) and discharging (or ramping down) sequence to make the final detection at DETECTION node 128. The enabler 250 is designed to provide a pulse of finite duration to first charge the external capacitor 114 (e.g., on the rising edge of the detection logic sequence pulse) and subsequently discharge the external capacitor 114 (e.g., on the falling edge of the detection logic sequence pulse). The detection logic sequence may be a direct controlling signal of the switches 208, 210, 218, 220. The length of the pulse provided by the enabler 250 needs to be greater than the duration it takes for ramping voltage at the sixth node 211 (e.g., VG2) above threshold voltage (Vth of the second transistor 226. In some examples, the length of this pulse may be of the order of 100 microseconds (e.g., as shown below in connection with FIGS. 7 and 8). In other examples, the length of the pulse may vary depending on the range of external capacitance to be detected reliably. In some examples, the enabler 250 turns the switches (208, 218) on until the second voltage VG2 charges up to a supply voltage (e.g., ramps to the supply voltage from supply 252). When the pulse goes low, the first switch 208 and the third switch 218 are turned off.

The second switch 210 and the fourth switch 220 turn on responsive to the first switch 208 and the third switch 218 turning off. In some examples, the initial charge of VG2 is approximately equal to the charge of the supply voltage from the supply 252 when the third switch 218 turns off and the fourth switch 220 turns on. The fourth switch 220 turns on and the charge at the sixth node 211 drops to ground. In this manner, the enabler 250 discharges the internal capacitor 224 and, thus, discharges the signal at the sixth node 211.

When the second voltage VG2 at the sixth node 211 discharges to ground, the second transistor 226 begins to turn off. The signal at the seventh node 213 is a logic high (1) responsive to the second transistor 226 turning off. For example, the second transistor 226 discontinues sinking current and, thus, the signal at the seventh node 213 goes high.

The signal at the latchz node 215 goes high responsive to the signal at the seventh node 213 going high. When the signal at the latchz node 215 is a logic high, the second latch 234 latches (e.g., locks) the signal at the DCEXT node 219. For example, the latchz node 215 is coupled to the clock input of the second latch 234 so that when the signal to the clock input goes high, the second latch 234 latches the signal at the data pin input which is coupled to the signal at the DCEXT node 219.

When the signal of the latch node 217 goes high, the signal at the DCEXT node 219 depends on the discharge rate of the external capacitor 114. For example, when the first switch 208 is turned off and the second switch 210 is turned on, the first voltage VG1 at PIN node 134 discharges. However, because the size of the external capacitor 114 is greater than the size of the internal capacitor 224 times the resistor ratio, the discharge rate of the first voltage VG1 is longer than the discharge rate of the second voltage VG2. Therefore, when the signal at the latchz node 215 goes high, the signal at the DCEXT node 219 is still high (e.g., because the first transistor 214 is still turned on and sinking current). In this manner, the second latch 234 latches a logic high and provides the logic high at the DETFALL node 223.

The third logic gate 240 obtains the signal at the DETFALL node 223. The third logic gate 240 obtains an inverted signal of the signal at the DETRISE node 221. The signal at the DETRISE node 221 is low (e.g., the first flop-flop 232 latches the logic low at the DCEXT node 219 when the first switch 208 and the third switch 218 are turned on and the external capacitor 114 is present) and, thus, the third logic gate 240 obtains a logic high signal (e.g., via the inverter). In some examples, the third logic gate 240 provides a logic high at the DET node 225. For example, the third logic gate 240 is an OR gate and provides a logic high when either input signal is a logic high.

In some examples, when the signal at the latchz node 215 goes high, the delay logic 242 obtains the logic high and initiates. For example, the delay logic 242 initiates responsive to a logic high input signal. In such an example, the delay logic 242 delays providing a logic high at the LATCHZ_DLY node 227 for a period of time. In some examples, the period to delay is greater than the amount of time it takes for the signal at the DETFALL node 223 to propagate from the output of the second latch 234 to the input of the third latch 244.

In some examples, when the delay logic 242 provides the logic high at the LATCHZ_DLY node 227, the third latch 244 latches the signal at the DET node 225. For example, the third latch 244 latches a logic high and provides the logic high signal at the DETECTION node 128. In such an example, the third latch 244, and/or more generally, the detector circuit 104, provides a signal notifying the controller 102 that the external capacitor 114 is coupled to the output of the LDO regulator 108. The example first operation described above is shown in a first signal plot 300 of FIG. 3.

In an example second operation of the detector circuit 104, the external capacitor 114 is not included in the system 100. For example, the output of the LDO regulator 108 does not include a capacitor coupled in parallel to the load 112. In the example second operation, the first switch 208 and the third switch 218 are enabled responsive to the rising edge of the detection logic sequence pulse from the enabler 250 and the second switch 210 and fourth switch 220 are turned off responsive to a falling edge of a detection logic sequence pulse from the enabler 250.

In some examples, the first resistor 212 generates the first voltage (VG1) responsive to the first switch 208 turning on and the second switch 210 turning off. Because the external capacitor 114 is not included in the system 100, VG1 increases to the supply voltage almost (e.g., approximately) immediately. For example, the first voltage (VG1) increases to the supply voltage at nearly the same time the first switch 208 turns on due to the missing external capacitor 114.

Simultaneously, the second RC network comprising the second resistor 222 and the internal capacitor 224 begins to charge responsive to the third switch 218 turning on and the fourth switch 220 turning off. The charging of the second RC network generates the second voltage (VG2). The second voltage VG2 ramps up at a slower rate than VG1 because external capacitor 114 is not present.

The first transistor 214 turns on responsive to the first voltage (VG1) exceeding the threshold voltage (Vth) of the first transistor 214. In such an example, the signal at the third node 205 equals a logic low responsive to the first transistor 214 turning on. When the signal at the third node 205 goes low, the first comparator 216 provides a logic high at the DCEXT node 219.

The second transistor 226 turns on responsive to the second voltage (VG2) exceeding the threshold voltage (Vth) of the second transistor 226. The signal at the seventh node 213 is a logic high (1) until the second transistor 226 turns on. The signal at the seventh node 213 goes low when the second transistor 226 turns on.

In the example second operation, the first transistor 214 turns on before the second transistor 226 because the first resistor 212 generates the threshold voltage (Vth) of the first transistor 214 faster than the second RC network, comprising the second resistor 222 and the internal capacitor 224, generates the threshold voltage (Vth) of the second transistor 226. In this manner, the signal at the third node 205 goes low before the signal at the seventh node 213 goes low. Therefore, when the signal at the DCEXT node 219 goes high, the signal at the latchz node 215 is still logic low.

In some examples, when the second transistor 226 turns on, the signal at the seventh node 213 goes low. The second comparator 228 obtains the low signal and provides the low signal at the latchz node 215. The first logic gate 230 inverts the signal at the latchz node 215 and provides the inverted signal at the latch node 217. The signal at the latch node 217 is a logic high responsive to the second comparator 228 providing the logic low.

When the signal at the latch node 217 goes high, the first latch 232 obtains the logic high at the clock input and latches the signal input to the data pin (e.g., the signal at the DCEXT node 219). In the example second operation the first latch 232 locks the logic high signal at the DCEXT node 219, since the DCEXT node 219 transitioned to logic high before latch node 217 and, thus, provides a logic high signal at the DETRISE node 221. The second logic gate 236 inverts the logic high signal at the DETRISE node 221 and provides a logic low signal to the first input terminal of the third logic gate 240.

The enabler 250 disables the first switch 208 and the third switch 218. The second switch 210 and the fourth switch 220 turn on responsive to the first switch 208 and the third switch 218 turning off. Prior to the enabler 250 swapping the logic states of the second switch 210 and the fourth switch 220, and the first switch 208 and the third switch 218, the first voltage (VG1) and the second voltage (VG2) are approximately equal to the supply voltage. This is ensured by constructing the width of the SW sequence pulse appropriately. Thus, when the first switch 208 is turned off and second switch 210 is turned on, the voltage at the PIN node 134 discharges to ground. Also, when the third switch 218 is turned off and the fourth switch 220 is turned on, the voltage at the sixth node 211 will be discharged to ground. In the second operation, the voltage at the PIN node 134 and, thus, the first voltage (VG1) discharges approximately instantaneously responsive to the first switch 208 turning off because the external capacitor 114 is not present Therefore, the first voltage (VG1) discharges faster than the second voltage (VG2).

In some examples, the first transistor 214 turns off when the first voltage (VG1) discharges below the threshold voltage of the first transistor 214. The signal at the third node 205 goes high responsive to the first transistor 214 turning off. The first comparator 216 obtains the input logic high signal at the third node 205 and provides an inverted version of the signal at the third node 205. For example, the first comparator 216 provides a logic low signal to the data pin input of the first latch 232 via the DCEXT node 219. The first latch 232 does not latch the logic low signal at the data pin input because the clock input (e.g., the signal at the latch node 217) is high (e.g., the clock input did not receive a rising edge signal that enables the latching of the data at the data pin). In this manner, the signal at the DETRISE node 221 is the logic high (1) and the second logic gate 236 provides the logic low (0) (e.g., inverts the logic high (1) from the DETRISE node 221 at the output) to the first input terminal of the third logic gate 240.

In some examples, the second transistor 226 turns off when the second voltage (VG2) discharges below the threshold voltage of the second transistor 226. In some examples, the second transistor 226 turns off after the first transistor 214 turns off in the second operation. The signal at the seventh node 213 goes high responsive to the second transistor 226 turning off. The second comparator 228 provides a logic high signal to the first logic gate 230, to the clock input of the second latch 234, and to the delay logic 242. For example, the signal at the latchz node 215 goes high responsive to the second transistor 226 turning off.

In some examples, the second latch 234 latches the signal at the data pin (e.g., the signal at the DCEXT node 219) responsive to the signal at the latchz node 215 going high. In this example, the second latch 234 latches a logic low (0) and provides the logic low to the DETFALL node 223. For example, the second latch 234 latches the signal at the DCEXT node 219 which is low because the first transistor 214 turns off before the second transistor 226 turns off.

The third logic gate 240 obtains the low signal at the DETFALL node 223. The third logic gate 240 obtains an inverted signal of the signal at the DETRISE node 221. The signal at the DETRISE node 221 is high (e.g., the first flop-flop 232 latches the logic high at the DCEXT node 219 when the first switch 208 and the third switch 218 are turned on and the external capacitor 114 is not present) and, thus, the third logic gate 240 obtains a logic low signal (e.g., via the second logic gate 236). The third logic gate 240 provides a logic low at the DET node 225 because the signal at the DETRISE node 221 is high and the signal at the DETFALL node 223 is low.

In some examples, when the signal at the latchz node 215 goes high, the delay logic 242 obtains the logic high and initiates. For example, the delay logic 242 initiates responsive to a logic high input signal. In such an example, the delay logic 242 delays providing a logic high at the LATCHZ_DLY node 227 for a period of time. In some examples, the period to delay is greater than the amount of time it takes for the signal at the DETFALL node 223 to propagate from the output of the second latch 234 to the input of the third latch 244.

In some examples, when the delay logic 242 provides the logic high at the LATCHZ_DLY node 227, the third latch 244 latches the signal at the DET node 225. For example, the third latch 244 latches a logic low and provides the logic low signal at the DETECTION node 128. In such an example, the third latch 244, and/or more generally, the detector circuit 104, provides a signal notifying the controller 102 that the external capacitor 114 is not coupled to the output of the LDO regulator 108 and/or is not operating properly at the output of the LDO regulator 108. The example second operation described above is shown in the second signal plot 400 of FIG. 4.

In some examples, the external capacitor 114, when included in the system 100 and operating within specifications, includes an initial charge. For example, the external capacitor 114 stores charge for a given voltage that may be provided by the load 112 and/or the LDO regulator 108 when the system 100 is in a down state (e.g., turned off or in a low Q state). The detector circuit 104 detects the external capacitor 114 regardless if the external capacitor 114 includes an initial charge or not. For example, in the first operation it is assumed that the external capacitor 114 does not include an initial charge (e.g., the charge stored in the external capacitor 114 is zero). However, in an imperfect scenario, the external capacitor 114 may include an initial charge.

In an example third operation, the external capacitor 114 is present in the system 100 and includes an initial charge that is less than the threshold voltage of the first transistor 214. In the example third operation, the external capacitor 114 is physically large and takes a long amount of time to charge relative to a physically smaller capacitor (e.g., such as the internal capacitor 224).

In the example third operation, the enabler 250 turns on the first switch 208 and the third switch 218 and turns off the second switch 210 and the fourth switch 220. The first RC network comprising the first resistor 212 and the external capacitor 114 generate the first voltage (VG1) responsive to the first switch 208 turning on and the second switch 210 turning off. The voltage at the external capacitor 114 (VG1) ramps up at a rate determined by the $R_1 C_{ext}$ time constant, where $C_{ext}$ includes an initial charge. The first voltage VG1 ramps up from the initial charge of the external capacitor 114.

Simultaneously, the second RC network comprising the second resistor 222 and the internal capacitor 224 begins to charge responsive to the third switch 218 turning on and the fourth switch 220 turning off. The charging of the second RC network generates the second voltage (VG2).

When the second voltage VG2 ramps above the threshold voltage (Vth) of the second transistor 226, the second transistor 226 turns on. The first current terminal (e.g., the drain terminal) of the second transistor 226 is coupled to the second current source (Idc2) 248 and coupled to the input terminal of the second comparator 228. Thus, when the second transistor 226 turns on, responsive to the VG2 ramping above the threshold voltage (Vth), the signal at the seventh node 213 goes low.

In some examples, when the signal at the seventh node 213 goes low, the signal at the output of the second comparator 228 also goes low. For example, the signal at latchz node 215 goes low. The first logic gate 230 provides a high signal at the latch node 217 responsive to the signal at the latchz node 215 going low. In some examples, the first latch 232 latches the signal at the DCEXT node 219 when the signal at the latch node 217 goes high. For example, the clock input of the first latch 232 is configured to receive the signal at the latch node 217. When the input signal to the clock input of the first latch 232 goes high, the first latch 232 latches (e.g., locks) the signal at the data pin input (e.g., the signal at the DCEXT node 219). For example, the first latch 232 provides the signal at the DCEXT node 219 responsive to the signal at the latch node 217 going high.

The signal at the DCEXT node 219 depends on the ramp rate of the first voltage VG1. In some examples, even though there is an initial charge of the external capacitor 114, the ramp rate of VG1 is slower than the ramp rate of VG2 and VG1 may not have enough time to ramp above the threshold voltage (Vth) of transistor 214, thus, the output of the first comparator 216 is logic low (e.g., the first transistor 214 is not turned on and the signal at the third node 205 is high) when the signal at the latch node 217 goes high. In this example, the first latch 232 latches the logic low signal and provides the logic low signal to the DETRISE node 221.

In some examples, the enabler 250 turns off the first switch 208 and the third switch 218 after a time period (e.g., the length of the detection logic sequence pulse).

The second switch 210 and the fourth switch 220 turn on responsive to the first switch 208 and the third switch 218 turning off. The initial voltage of VG2 is approximately equal to the supply voltage when the third switch 218 turns off. In this example, when the third switch 218 is turned off, the enabler 250 turns the fourth switch 220 on. The fourth switch 220 turns on and the charge at the sixth node 211 drops to ground.

When the second voltage VG2 at the sixth node 211 discharges to ground, the second transistor 226 begins to turn off. For example, when the second voltage VG2 drops below the threshold voltage (Vth) of the second transistor 226, the second transistor 226 turns off. The signal at the seventh node 213 is a logic high (1) responsive to the second transistor 226 turning off.

The signal at the latchz node 215 goes high responsive to the signal at the seventh node 213 going high. When the signal at the latchz node 215 is a logic high, the second latch 234 latches (e.g., locks) the signal at the DCEXT node 219. For example, the latchz node 215 is coupled to the clock input of the second latch 234 so that when the signal to the clock input goes high, the second latch 234 latches the signal at the data pin input (e.g., the signal at the DCEXT node 219).

When the signal of the latch node 217 goes high, the signal at the DCEXT node 219 depends on the discharge rate of the external capacitor 114. In some examples, the first transistor 214 does not turn on before the first switch 208 is turned off. For example, the VG1 ramp rate may be too slow to meet the threshold voltage of the first transistor 214 during the high pulse provided by the controller 102. Therefore, the first transistor 214 does not turn on during the third operation. When the signal at the latchz node 215 goes high, the signal at the DCEXT node 219 is still low (e.g., because the first transistor 214 is still turned off). In this manner, the second latch 234 latches a logic low and provides the logic low at the DETFALL node 223.

The third logic gate 240 obtains the low signal at the DETFALL node 223. The third logic gate 240 obtains an inverted signal of the signal at the DETRISE node 221. The signal at the DETRISE node 221 is low (e.g., the first flop-flop 232 latches the logic low at the DCEXT node 219 when the first switch 208 and the third switch 218 are turned on and the external capacitor 114 is present) and, thus, the third logic gate 240 obtains a logic high signal (e.g., via the inverter). In some examples, the third logic gate 240 provides a logic high at the DET node 225.

In some examples, when the signal at the latchz node 215 goes high, the delay logic 242 obtains the logic high and initiates. For example, the delay logic 242 initiates responsive to a logic high input signal. In such an example, the delay logic 242 delays providing a logic high at the LATCHZ_DLY node 227 for a period of time. In some examples, the period to delay is greater than the amount of time it takes for the signal at the DETFALL node 223 to propagate from the output of the second latch 234 to the input of the third latch 244.

In some examples, when the delay logic 242 provides the logic high at the LATCHZ_DLY node 227, the third latch 244 latches the signal at the DET node 225. For example, the third latch 244 latches a logic high and provides the logic high signal at the DETECTION node 128. In such an example, the third latch 244, and/or more generally, the detector circuit 104, provides a signal notifying the controller 102 that the external capacitor 114 is coupled to the output of the LDO regulator 108. The example third operation described above is shown in a third signal plot 500 of FIG. 5.

In an example fourth operation, the external capacitor 114 is present in the system 100 and includes an initial charge that is greater than the threshold voltage of the first transistor 214. In the example third operation, the external capacitor 114 is physically large and takes a long amount of time to charge relative to a physically smaller capacitor (e.g., such as the internal capacitor 224).

In the example fourth operation, the first transistor 214 is on before the first switch 208 is turned on because the initial charge of the external capacitor 114 is greater than the threshold voltage of the first transistor 214. The enabler 250 provides the SW sequence and the $\overline{SW}$ sequence, which is configured to turn on the first switch 208 and the third switch 218 and turn off the second switch 210 and the fourth switch 220. The charge at the PIN node 134 (e.g., the first voltage VG1) continues to ramp up to the supply 252 responsive to the first switch 208 turning on. The signal at the third node 205 is low before and during the charging of the signal at the PIN node 134 because the first transistor 214 is turned on. The first comparator 216 provides a logic high at the DCEXT node 219.

In this manner, when the second transistor 226 turns on, the first latch 232 latches the high signal at the DCEXT node 219. For example, the first logic gate 230 provides a high signal responsive to the second comparator 228 providing a logic low at the latchz node 215, causing the clock input of the first latch 232 to go high and latch the signal at the data pin. The first latch 232 provides a logic high at the DETRISE node 221.

During a discharge phase of the detector circuit 104 (e.g., the phase that occurs when the enabler 250 turns off the first switch 208 and the third switch 218 and turns on the second switch 210 and the fourth switch 220), the second transistor 226 turns off before the first transistor 214 because the discharge rate of VG2 is faster than the discharge rate of VG1 due to the size of the external capacitor 114. In this manner, the second comparator 228 provides a logic high at the latchz node 215 when the second transistor 226 turns off.

The second latch 234 obtains the logic high from the second comparator 228 (e.g., via the latchz node 215) at the clock input. The second latch 234 latches the signal at the DCEXT node 219 responsive to the high signal at the clock input. In the example fourth operation, the signal at the DCEXT node 219 is high when the second transistor 226 turns off because the first voltage (VG1) is still above the threshold voltage of the first transistor 214. Therefore, the second latch 234 latches the high signal at the DCEXT node 219 and provides the high signal to the third logic gate 240 via the DETFALL node 223.

The signal at the DETRISE node 221 is high and the signal at the DETFALL node 223 is high. The third logic gate 240 obtains an inverted version of the signal at the DETRISE node 221 (e.g., a logic low) at the first input terminal and obtains the signal at DETFALL node 223 (e.g., a logic high) at the second input terminal. The third logic gate 240 provides a logic high to the data pin of the third latch 244 via the DET node 225 responsive to the high input signal at the second input terminal (e.g., the high signal at the DETFALL node 223).

Also, the delay logic 242 provides a high signal to the LATCHZ_DLY node 227 responsive to the delay period ending. For example, the input of the delay logic 242 obtains the high signal at the latchz node 215, delays for a time period, then provides a logic high signal to the clock input of the third latch 244. The third latch 244 latches the signal at the data pin (e.g., the logic high signal at the DET node 225) responsive to obtaining the logic high signal from the delay logic 242. In such an example, the third latch 244, and/or more generally, the detector circuit 104, provides a signal notifying the controller 102 that the external capacitor 114 is coupled to the output of the LDO regulator 108. The example fourth operation described above is shown in a fourth signal plot 600 of FIG. 6.

The external capacitor 114 of FIGS. 1 and 2 is detectable using the detector circuit 104 when the external capacitor 114 is a capacitance above a target size. For example, when implementing the LDO regulator 108 and the detector circuit 104, the size of the external capacitor 114 matters for two reasons. The first reason is to stabilize the feedback loop of the LDO regulator 108. The second reason is that the external capacitor 114 is used as a decoupling capacitor to help stabilize the voltage at the output of the LDO regular 108.

For example, at the output of the LDO regulator 108, there may be a parasitic capacitance formed by the printed circuit board (PCB) and/or by the device containing the system 100. In this manner, the target size of the external capacitor 114 has to be greater than the largest parasitic capacitance. The largest parasitic capacitance can be determined by the PCB and/or by the device containing the system 100. The target size of the external capacitor 114 is selected to be greater than this parasitic capacitance.

In some examples, the target size of the external capacitor 114 can be determined using the capacitance of the internal capacitor 224 and the resistances of the first resistor 212 and the second resistor 222. For example, the target size of the external capacitor 114 can be determined using Equation 1 below.

$$C_{target} = C_{int} \times \left(\frac{R2}{R1}\right) \qquad \text{Equation 1}$$

In Equation 1 above, the internal capacitor 224 multiplied by the resistor ratio between the first resistor (R1) 212 and the second resistor (R2) 222 to determine the target size of the external capacitor 114. The ratio of the first resistor 212 and the second resistor 222 is selected based on the size of the internal capacitor 224. For example, if the largest parasitic capacitance of the output of the LDO regulator 108 is C, and the size of the internal capacitor 224 is $C_{int}$, then the ratio M between the first resistor 212 and second resistor 222 is C divided by $C_{int}$. Therefore, the variation of the target size of the external capacitor 114 only depends on the variation of the internal capacitor 224.

The resistance of the second resistor 222 is greater than the resistance of the first resistor 212 to generate an appropriate voltage ramp rate at the sixth node 211 when the external capacitor 114 is present. In some examples, the detector circuit 104 may be configured to generate the voltage ramps at the PIN node 134 and the sixth node 211 based on current and capacitance. However, using resistors (212, 222) to generate the voltage ramps provides significant benefits in terms of area and matching.

Advantageously, the logic circuit 206 of the detector circuit 104 generates the detection signal based on the comparison between the voltage ramp rate generated by the external capacitor 114 in the external capacitor charging circuit 202 and the voltage ramp rate generated by the internal capacitor 224 in the reference charging circuit 204. Only a single pulse controlling the switches is required to generate the voltage ramps, as long as the detection logic sequence pulse provides a time longer than it takes to charge and discharge the internal capacitor 224. A continuous clock signal is not required. Therefore, the accuracy of the detector circuit 104 does not rely on a reference voltage, a clock signal, and/or an accurate timer but merely relies on the variation of the internal capacitor 224.

Figure 3:
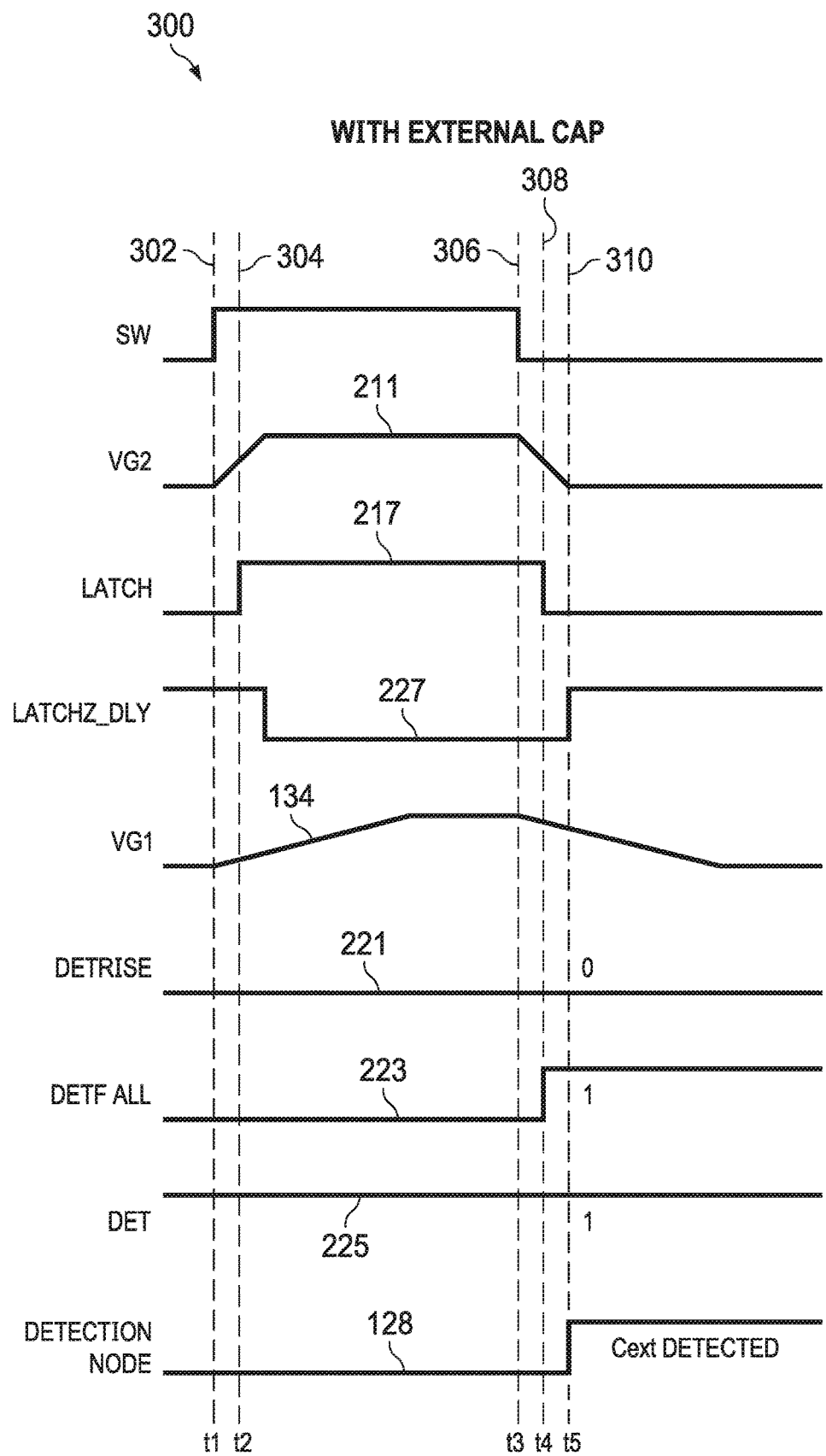
FIGS. 3-6 are example signal plots of a response of elements of the example detector circuit of FIGS. 1 and 2 based on conditions of the capacitor.
Figure 4:
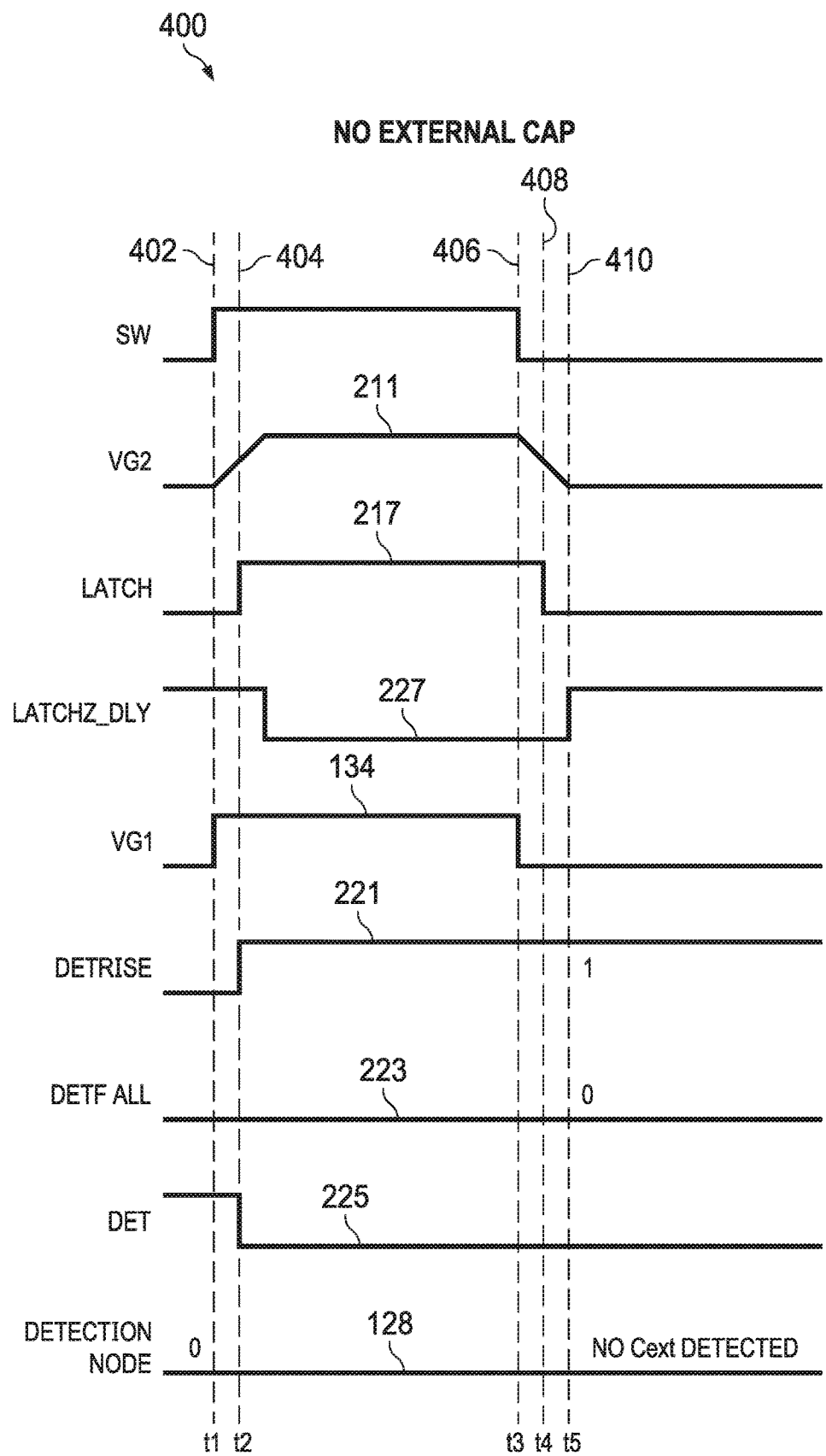
Figure 5:
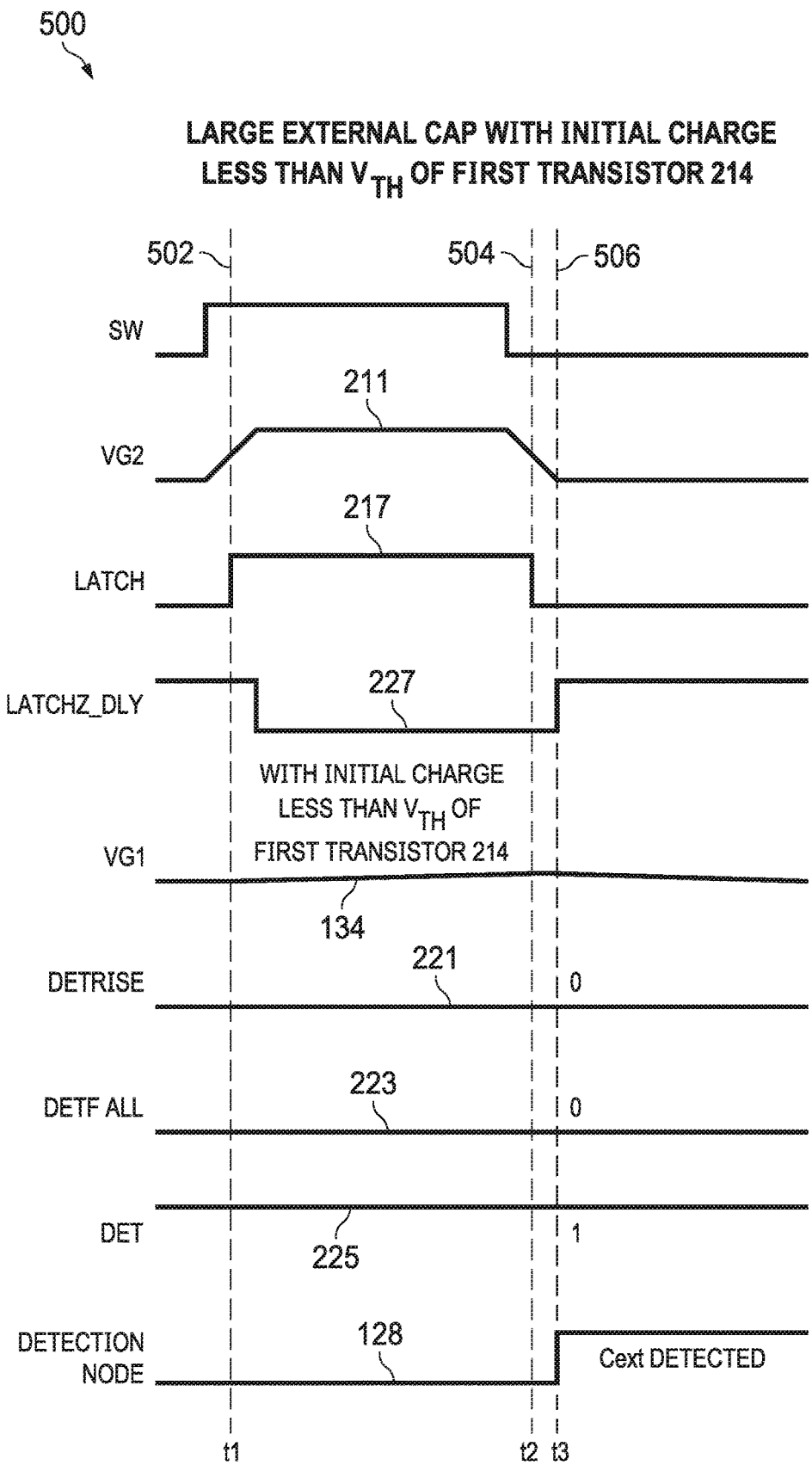
Figure 6:
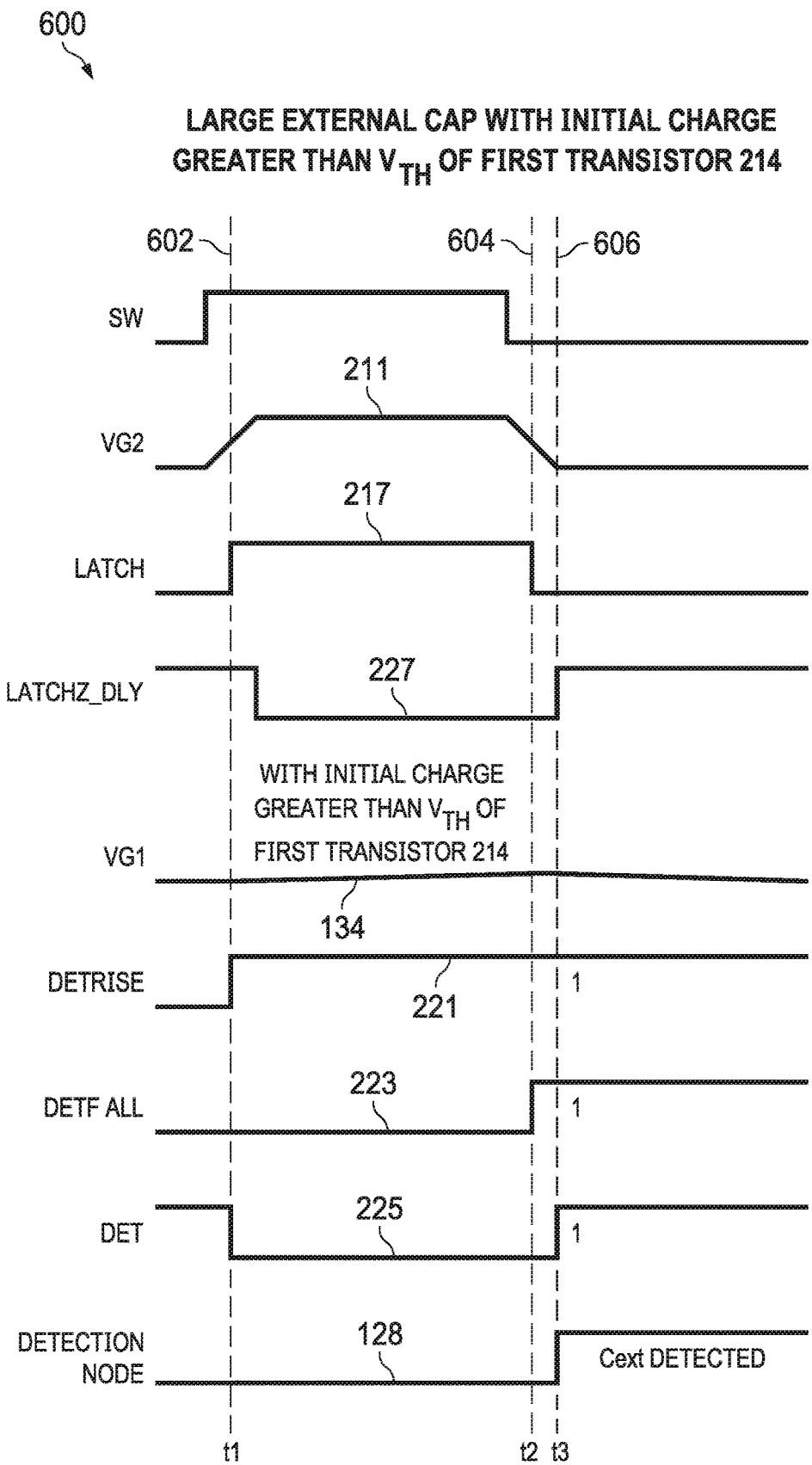

FIGS. 3-6 are the example first signal plot 300, the example second signal plot 400, the example third signal plot 500, and the example fourth signal plot 600. FIG. 3 is the example first signal plot 300 illustrating a response of the elements of the example detector circuit 104 of FIG. 2 during the first operation when the external capacitor 114 is present. FIG. 4 is the example second signal plot 400 which is a signal plot illustrating a response of the elements of the example detector circuit 104 of FIG. 2 during the second operation when the external capacitor 114 is not present. FIG. 5 is the example third signal plot 500 which is a signal plot illustrating a response of the elements of the example detector circuit 104 of FIG. 2 during the third operation when the external capacitor 114 is present and includes an initial charge less than the threshold voltage of the first transistor 214. FIG. 6 is the example fourth signal plot 600 which is a signal plot illustrating a response of the elements of the example detector circuit 104 of FIG. 2 during the fourth operation when the external capacitor 114 is present and includes an initial charge that is greater than the threshold voltage of the first transistor 214.

Referring to FIG. 3, the first signal plot 300 illustrates the signals at nodes in the detector circuit 104. In the first plot 300, the SW sequence, provided by the enabler 250, goes high at time t1 302. For example, the enabler 250 generates the SW sequence signal configured to turn on the first switch 208 and the third switch 218 and generates the $\overline{SW}$ sequence signal configured to turn off the second switch 210 and the fourth switch 220. The signal at the sixth node 211 (e.g., the second voltage VG2) begins to increase at a ramp rate, responsive to the signal at the SW sequence going high, at time t1 302. For example, the second resistor 222 and the internal capacitor 224 charge the signal at the sixth node 211 to generate second voltage (VG2). The signal at the PIN node 134 (e.g., the first voltage VG1) begins to increase at a ramp rate, responsive to the SW sequence going high, at time t1 302.

The signal at the sixth node 211 meets the threshold voltage of the second transistor 226 at time t2 304. For example, the second resistor 222 and the internal capacitor 224 generate the threshold voltage (Vth) of the second transistor 226 between time t1 302 and time t2 304. The signal at the latch node 217 goes high responsive to the signal at the sixth node 211 meeting the threshold voltage (Vth) of the second transistor 226 at time t2 304. For example, the second transistor 226 turns on, causing the input signal to the second comparator 228 (e.g., the signal at the seventh node 213) to go low. The second comparator 228 provides a logic low at the latchz node 215 causing the first logic gate 230 to invert the logic low and provides a logic high at the latch node 217.

The signal at the PIN node 134 (e.g., VG1) increases slower than the signal at the sixth node 211 (VG2) and, thus, VG1 is does not meet or exceed the threshold voltage (Vth) of the first transistor 214 at time t2 304. Therefore, the first latch 232 latches the logic low provided by the first comparator 216 and provides the logic low at the DETRISE node 221 at time t2 304.

The enabler 250 provides a falling edge of the SW sequence to the first switch 208 and the third switch 218 at time t3 306, and a rising edge of the SW sequence to the second switch 210 and the fourth switch 220 at time t3 306. For example, the enabler 250 turns off the first switch 208 and the third switch 218 at time t3 306 and turns on the second switch 210 and the fourth switch 220 at time t3 306. The signal at the sixth node 211 begins to decrease at a ramp rate at time t3 306. For example, VG2 discharges responsive to the third switch 218 turning off and fourth switch 220 turning on. Also, the signal at the PIN node 134 begins to decrease at a ramp rate at time t3 306. For example, VG1 discharges responsive to the first switch 208 turning off and the second switch 210 turning on.

The fourth switch 220, the second resistor 222, and the internal capacitor 224 discharge the signal at the sixth node 211 below the threshold voltage (Vth) of the second transistor 226 at time t4 308. For example, VG2 falls below the threshold voltage of the second transistor 226 at time t4 308. The signal at the latch node 217 goes low at time t4 308 responsive to VG2 falling below Vth of the second transistor 226. For example, the second transistor 226 turns off responsive to not having a high enough input at the gate terminal which causes the input to the second comparator 228 to go high (e.g., the signal at the seventh node 213 to be a high signal). The second comparator 228 provides the logic high to the latchz node 215 at time t4 308.

The second latch 234 latches the signal at the DCEXT node 219 at time t4 308 responsive to obtaining the logic high of the latchz node 215. The signal at the DCEXT node 219 is a logic high because the first transistor 214 is on (e.g., VG1 does not fall below the threshold voltage of the first transistor 214 when VG2 falls below the threshold voltage of the second transistor 226). In this manner, the signal at the DETFALL node 223 goes high at time t4 308 because the second latch 234 latches the logic high signal at the DCEXT node 219.

The delay logic 242 provides a logic high at the LATCHZ_DLY node 227 at time t5 310. For example, the delay logic 242 obtains the logic high at the latchz node 215 at time t4 308 and delays providing the logic high until time t5 310. The third latch 244 obtains the high input of the LATCHZ_DLY node 227 at the clock input and latches the signal at the DET node 225 at time t5 310. For example, the third logic gate 240 provides a logic high at the DET node 225 when the third logic gate 240 obtains the high signal of the DETFALL node 223 at time t4 308. In this manner, when the third latch 244 is enabled (e.g., when the clock input is high), the third latch 244 provides whatever signal is at the data pin (e.g., the signal at the DET node 225). Therefore, at time t5 310, the third latch 244 latches the logic high signal of the DET node 225 and provides the logic high signal at the DETECTION node 128.

Referring to FIG. 4, the second signal plot 400 illustrates the signals at nodes in the detector circuit 104. In the second signal plot 400, the SW sequence signal goes high at time t1 402. For example, the enabler 250 generates the SW sequence signal configured to turn on the first switch 208 and the third switch 218 and generates the $\overline{SW}$ sequence signal configured to turn off the second switch 210 and the fourth switch 220. The signal at the sixth node 211 (e.g., the second voltage VG2) begins to increase at a ramp rate, responsive to the third switch 218 turning on and the fourth switch 220 turning off, at time t1 402. For example, the second resistor 222 and the internal capacitor 224 charge the signal at the sixth node 211 to generate second voltage (VG2).

The signal at the PIN node 134 (e.g., the first voltage VG1) increases to the supply voltage at time t1 302. For example, the external capacitor 114 is not present and does not resist the change in voltage supplied by the first switch 208 and the first resistor 212 when the first switch 208 is turned on. Therefore, VG1 (e.g., the signal at the PIN node 134) increases approximately simultaneously to the supply voltage.

The latch node 217 goes high at time t2 404 responsive to the signal at the sixth node 211 meeting the threshold voltage of the second transistor 226. For example, the first logic gate 230 inverts the signal at the latchz node 215 when the second comparator 228 provides a logic low at time t2 404 responsive to the second transistor 226 turning on. The high signal at the latch node 217 enables the first latch 232 and, thus, the first latch 232 latches the signal at the DCEXT node 219 at time t2 404. In some examples, the signal at the DCEXT node 219 is a logic high because the first transistor 214 is turned on at time t1 402 and remains on when the second transistor 226 turns on at time t2 404.

The signal at the DETRISE node 221 goes high at time t2 404 responsive to the first latch 232 latching the high signal at the DCEXT node 219. The signal at the DET node 225 goes low at time t2 404 responsive to the second logic gate 236 inverting the high signal at the DETRISE node 221. For example, the inverted version of the signal at the DETRISE node 221 is input to the first input terminal of the third logic gate 240 and the signal at the DETFALL node 223 (e.g., a logic low signal) is input to the second input terminal of the third logic gate 240 thus causing the third logic gate 240 to output a logic low signal at the DET node 225 at time t2 404.

The enabler 250 provides a logic low of the SW sequence at time t3 406. The signal at the sixth node 211 begins to discharge at time t3 406 at a ramp rate responsive to the SW sequence. The signal at the PIN node 134 discharges to ground at time t3 406, turning the first transistor 214 off. The first comparator 216 provides a logic low at the DCEXT node 219 at time t3 406 responsive to the first transistor 214 turning off.

The signal at the latch node 217 goes low at time t4 408 responsive to the signal at the sixth node 211 falling below the threshold voltage of the second transistor 226. Also, the signal at the latchz node 215 goes high at time t4 408 responsive to the signal at the sixth node 211 falling below the threshold voltage of the second transistor 226.

The second latch 234 latches the signal at the DCEXT node 219 at time t4 408 responsive to the high input at the latchz node 215. For example, the second latch 234 provides a logic low at the DETFALL node 223 at time t4 408 responsive to obtaining a high signal at the clock input of the second flip-flip 234.

The delay logic 242 provides a logic high at the LATCHZ_DLY node 227 at time t5 410 responsive to delaying the high input signal received at time t4 408. The third latch 244 latches the signal at the DET node 225 at time t5 410 responsive to obtaining the high input signal from the delay logic 242 at the clock input of the third latch 244. The signal at the DET node 225 is a logic low due to the first transistor 214 turning on before the second transistor 226 at time t1 402 and the first transistor 214 turning off before the second transistor 226 at time t3 406. Therefore, third latch 244 provides a logic low at the DETECTION node 128.

Referring to FIG. 5, the third signal plot 500 illustrates the signals at nodes in the detector circuit 104 during the third operation. The third operation of the detector circuit 104 begins in a similar manner as the first and second operations. For example, the first switch 208 and the third switch 218 are turned on and the signal at the PIN node 134 and the sixth node 211 increase from their initial state. In the third signal plot 500, the signal at the PIN node 134 is ramping up from a charged initial state at a time when the SW sequence goes high. The initial charge of the signal at the PIN node 134 is less than the threshold voltage of the first transistor 214.

The signal at the latch node 217 goes high at time t1 502 responsive to the signal at the sixth node 211 meeting the threshold voltage of the second transistor 226. For example, the second resistor 222 and the internal capacitor 224 generate the second voltage (VG2) that turns on the second transistor 226. The second transistor 226 turns on at time t1 502 causing the second comparator 228 to provide a logic low at the latchz node 215. The first logic gate 230 inverts the signal at the latchz node 215 and provides the logic high signal at the latch node 217 at time t1 502.

The first latch 232 latches the signal at the DCEXT node 219 at time t1 502 responsive to the signal at the latch node 217 going high. The signal at the DCEXT node 219 is low at time t1 502 because the first transistor 214 is not turned at time t1 502. Therefore, the first latch 232 provides a logic low at the DETRISE node 221.

The signal at the latch node 217 goes low at time t2 504 responsive to the second transistor 226 turning off. For example, the enabler 250 turns off the first switch 208 and the third switch 218 and the signal at the sixth node 211 discharges below the threshold voltage of the second transistor 226 at time t2 504.

The second latch 234 latches the signal at the DCEXT node 219 at time t2 504. For example, the second latch 234 latches the logic low signal at the DCEXT node 219 (e.g., the first transistor 214 is turned off and the signal at the third node 205 is high) at time t2 504. The signal at the DETFALL node 223 is low at time t2 504.

The delay logic 242 provides a high signal at the LATCHZ_DLY node 227 at time t3 506 responsive to the signal at the latchz node 215 going high for a delay period. For example, when the second transistor 226 turns off, the second comparator 228 provides a logic high to input of the delay logic 242. When the signal at the LATCHZ_DLY node 227 goes high, the third latch 244 latches the signal at the DET node 225 at time t3 506.

The signal at the DET node 225 is high. For example, the third logic gate 240 obtains the inverted version of the signal at the DETRISE node 221 (e.g., a logic high) and the signal at the DETFALL node 223 (e.g., logic low) at time t3 506. The third logic gate 240 provides a logic high signal at the DET node 223 at time t3 506 because the third logic gate 240 is an OR gate and at least one of the input terminals is receiving a logic high signal.

The third latch 244 provides the logic high signal at the DETECTION node 128 at time t3 506. Therefore, the external capacitor 114 is detected, regardless of the initial charge.

Referring to FIG. 6, the fourth signal plot 600 illustrates the signals at nodes in the detector circuit 104 during the fourth operation. The fourth operation of the detector circuit 104 begins in a similar manner as the first, second, and third operations. For example, the first switch 208 and the third switch 218 are turned on and the signal at the PIN node 134 and the sixth node 211 increase from their initial state. In the fourth signal plot 600, the signal at the PIN node 134 is ramping up from a charged initial state at a time when the SW sequence goes high. The initial charge of the signal at the PIN node 134 is greater than the threshold voltage of the first transistor 214.

The signal at the sixth node 211 increases beyond the threshold voltage of the second transistor 226 at time t1 602 and, thus, the signal at the latch node 217 goes high. For example, the second transistor 226 turns on responsive to the signal at the sixth node 211 increasing beyond the threshold voltage of the second transistor 226 and the second comparator 228 provides a logic low at the latchz node 215, causing the first logic gate 230 to provide a logic high at the latch node 217.

The first latch 232 latches the signal at the DCEXT node 219 at time t1 602 responsive to the signal at the latch node 217 going high. The first latch 232 latches a logic high signal at the DCEXT node 219 because the initial charge of the external capacitor 114 is greater than the threshold voltage of the first transistor 214 and, thus, the first transistor 214 is turned on before time t1 602. The first latch 232 provides a logic high at the DETRISE node 221 at time t1 602. The second logic gate 236 provides a logic low to the input of the third logic gate 240 at time t1 602, and the second latch 234 does not provide a signal to the third logic gate 240 at time t1 602. Therefore, the signal at the DET node 223 goes low responsive to the third logic gate 240 providing a logic low at time t1 602.

The signal at the sixth node 211 decreases below the threshold voltage of the second transistor 226 at time t2 604 and, thus, the signal at the latch node 217 goes low. For example, the signal at the latchz node 215 goes high responsive to the second transistor 226 turning off at time t2 604.

The second latch 234 latches the signal at the DCEXT node 219 responsive to the latchz node 215 going high at time t2 604. In this example, the second latch 234 latches a logic high signal at the DCEXT node 219 because the signal at the PIN node 134 does not decrease below the threshold voltage of the first transistor 214 at time t2 604. The second latch 234 provides a logic high at the DETFALL node 223 at time t2 604 responsive to latching the high signal at the DCEXT node 219.

The delay logic 242 initiates at time t2 604 responsive to the signal at the latchz node 215 going high. For example, the delay logic 242 begins the delay period at time t2 604. The delay logic 242 provides a logic high at the LATCHZ_DLY node 227 at time t3 606. For example, the delay period occurs between time t2 602 and t3 606 and the delay logic 242 provides a logic high when the delay period ends (e.g., at time t3 606).

The third flip-flop 244 latches the signal at the DET node 225 responsive to the signal at the LATCHZ_DLY node 227 going high. In this example, the signal at the DET node 225 is high at time t3 606 because the signal at the DETFALL node 223 is high at time t3 606. The third latch 244 provides the logic high signal at the DETECTION node 128. Therefore, the external capacitor 114 is detected, regardless of the initial charge.

Figure 7:
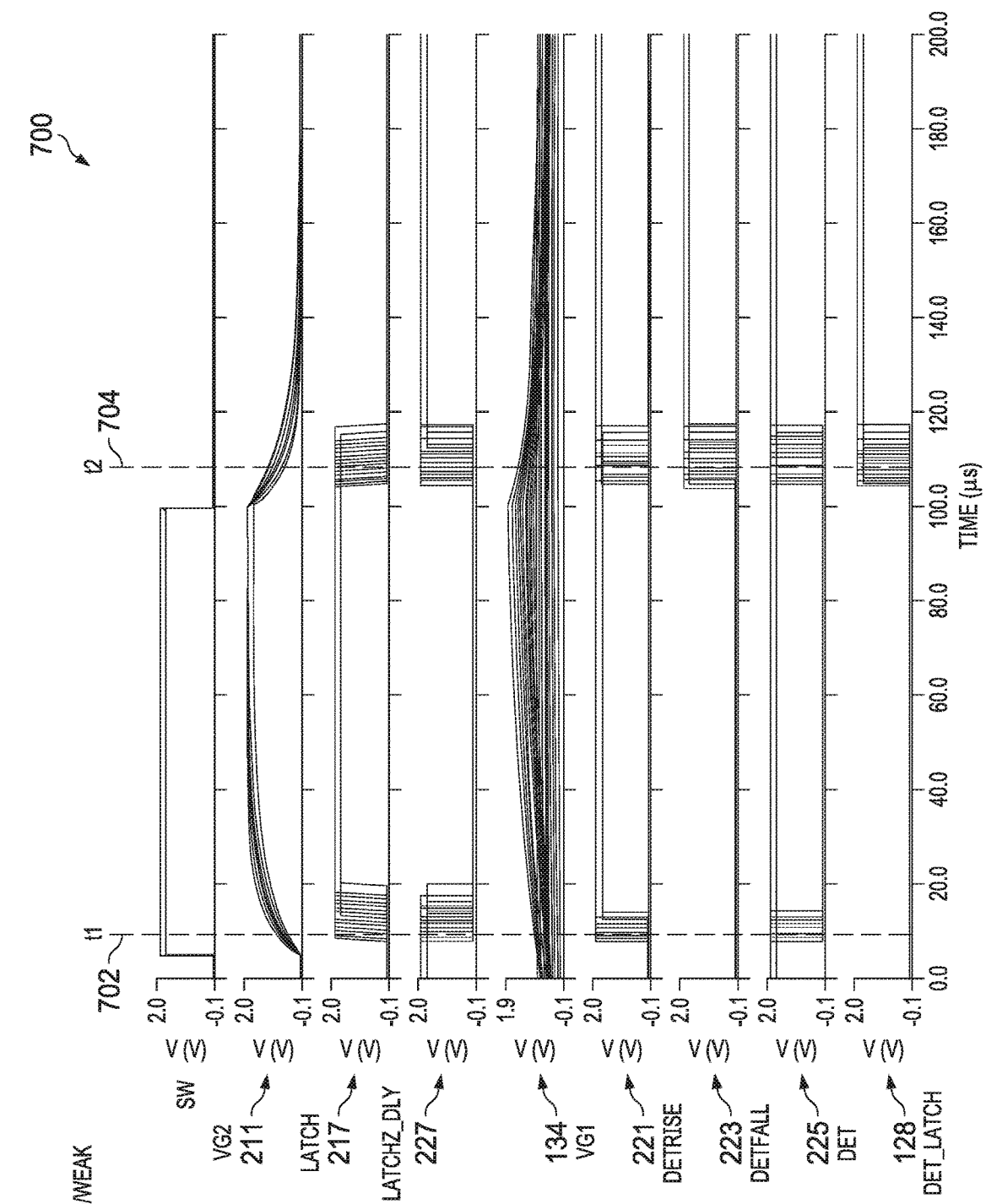
FIGS. 7 and 8 are example simulation results of responses of the elements of the example detector circuit of FIGS. 1 and 2 based on conditions of the capacitor.
Figure 8:
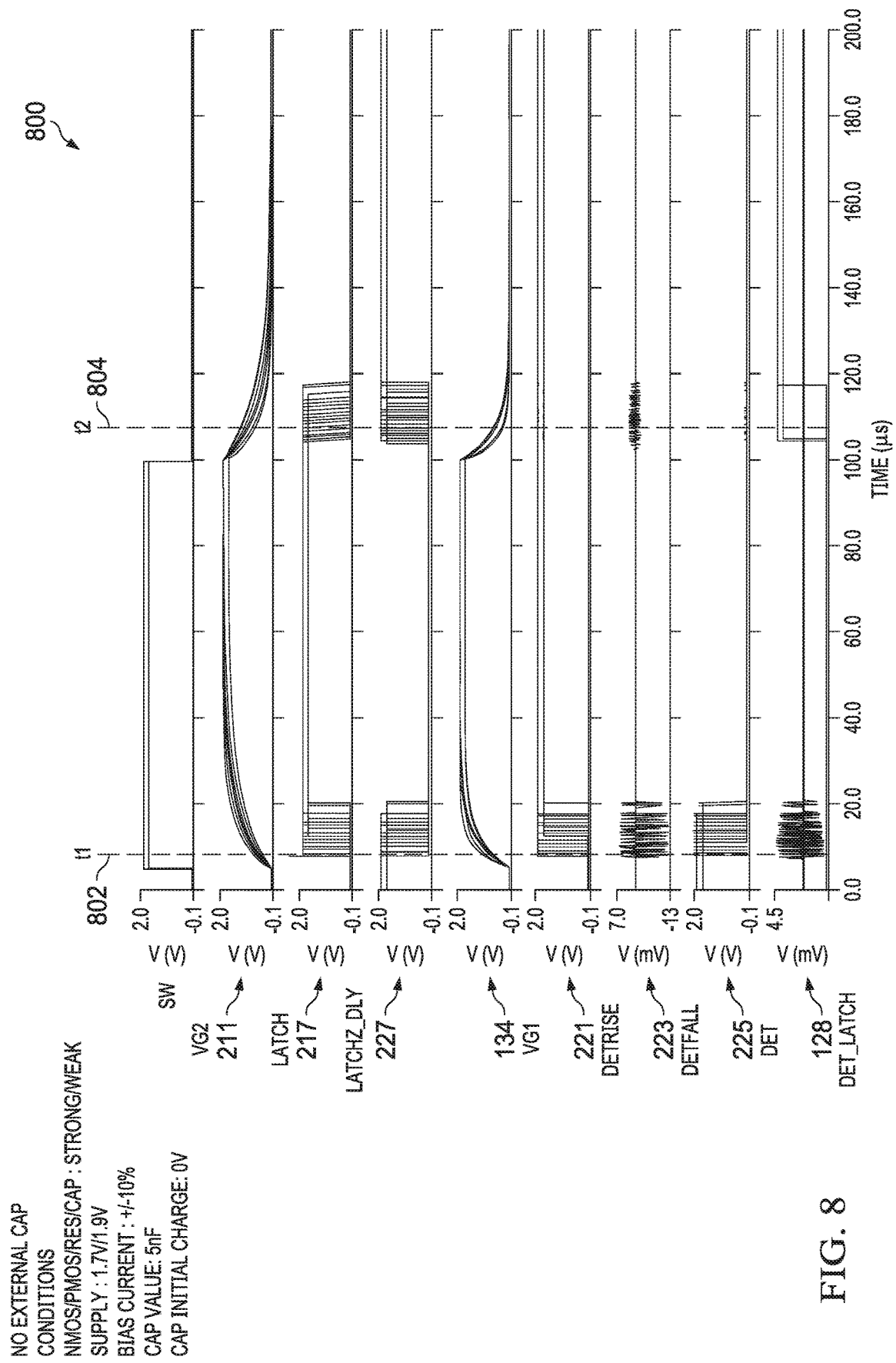

FIGS. 7 and 8 are simulation results of responses of the elements of the example detector circuit 104. FIG. 7 is a first simulation result 700 corresponding to the first signal plot 300 of FIG. 3, the third signal plot 500 of FIG. 5, and the fourth signal plot 600 of FIG. 6. FIG. 8 is a second simulation result 800 corresponding to the second signal plot 400 of FIG. 4.

The first simulation result 700 of FIG. 7 shows the signals at the various nodes of the detector circuit 104 when the external capacitor 114 is present with a capacitance of 50 nF, 100 nF, 200 nF, 500 nF and 1 µF and an initial charge of 0 volts to 0.8 volts with a step of 0.1 volts, and a supply voltage of 1.7 volts to 1.9 volts. The first simulation result 700 illustrates 16 conditions of strong and weak combinations of the first transistor 214, the second transistor 226, the first and second resistors 212, 222, and the external capacitor 114. For example, the strong and weak combinations correspond to the strong and weak fabrications of each of the above mentioned components. All of the 16 conditions of the detector circuit 104 illustrated in the first simulation result 700 have a bias current of approximately 10 percent variation.

In the first simulation result 700, the signal at the latch node 217 goes high at time t1 702 responsive to the signal at the sixth node 211 (VG2) increasing to the threshold voltage (e.g., approximately 1 volt) and turning the second transistor 226 on. Additionally, in an example of the first simulation result 700, the signal at the PIN node 134 (e.g., VG1) does not meet the threshold voltage of the first transistor 214 at time t1 702 because the external capacitor 114 causes the signal at the PIN node 134 to ramp slower than the signal at the sixth node 211 (e.g., as described above in connection with FIG. 3). In another example of the first simulation result 700, the signal at the PIN node 134 does meet the threshold voltage of the first transistor 214 at time t1 702 when the external capacitor 114 has an initial charge that is greater than the threshold voltage (e.g., as described above in connection with FIG. 6). In another example of the first simulation result 700, the signal at the PIN node 134 does not meet the threshold voltage of the first transistor 214 at time t1 702 because the external capacitor 114 has an initial charge that is less than the threshold voltage of the first transistor 214 and the capacitance is greater than the capacitance of the internal capacitor 224 (e.g., as described above in connection with FIG. 5).

In the first simulation result 700 of FIG. 7, the transitions between high and low throughout the different nodes directly corresponds to the transitions between high and low of the signals illustrated in the first signal plot 300, the third signal plot 500, and the fourth signal plot 600. In all examples, the signal at the DETECTION node 128 goes high at the end of the detection (e.g., at time t2 704), to indicate that the external capacitor 114 is present.

The second simulation result 800 of FIG. 8 shows the signals at the various nodes of the detector circuit 104 when the external capacitor 114 is not present. For example, the second simulation result 800 illustrates the response of the elements in the detector circuit 104 when the supply voltage is 1.7 volts to 1.9 volts, and the external capacitor 114 is not present. In the second simulation result 800, the signal at the PIN node 134 (VG1) increases at a faster ramp rate than the signal at the sixth node 211 (VG2) responsive to the first switch 208 and the third switch 218 turning on at time t1 802. In the second simulation result 800, the signal at the DETECTION node 128 remains low at the end of the detection at time t2 804 to indicate that the external capacitor 114 is not present.

In the second simulation result 800 of FIG. 8, the transitions between high and low throughout the different nodes directly corresponds to the transitions between high and low of the signals illustrated in the second signal plot 400.

Figures 9, 10:
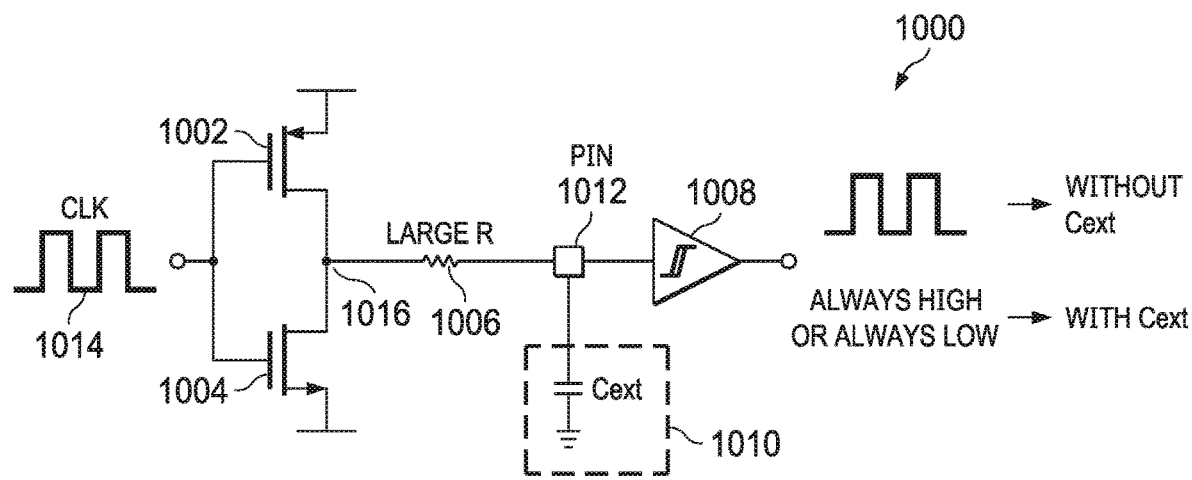
FIG. 9 is an example truth table showing the signals at different points in the detector circuit FIGS. 1 and 2 based on conditions of the capacitor.
FIG. 10 is a schematic of an example first capacitor detection circuit to detect a capacitor.

FIG. 9 is an example truth table 900 showing the signals at the DETRISE node 221, the DETFALL node 223, and the DETECTION node 128 during four example conditions of the detector circuit 104 of FIG. 2 corresponding to the four example operations.

For example, the truth table 900 illustrates the signals at the DETRISE node 221, the DETFALL node 223, and the DETECTION node 128 for the first condition 902, when no external capacitor 114 is present in the system 100. During the first condition 902, when the third latch 244 latches the signal at the DET node 225, the output of the first latch 232 is a logic high (1) at the DETRISE node 221 and the output of the second latch 234 is a logic low (0) at the DETFALL node 223. The third logic gate 240 obtains the inverted signal at the DETRISE node 221 (e.g., a logic low (0)) and the low signal (0) at the DETFALL node 223 and provides a logic low (0) to the data pin of the third latch 244. In this manner, the signal at the DETECTION node 128 is logic low (0), indicating that the external capacitor 114 is not coupled to the output of the LDO regulator 108.

The truth table 900 illustrates the signals at the DETRISE node 221, the DETFALL node 223, and the DETECTION node 128 for the second condition 904, when the external capacitor 114 is included in the system 100 with no initial charge. At the time the third flip-flop 244 is enabled (e.g., when the signal at the LATCHZ_DLY node 227 goes high), the signal at the DETRISE node 221 is logic low (0) and the signal at the DETFALL node 223 is logic high (1). The third logic gate 240 obtains the inverted signal at the DETRISE node 221 (e.g., a logic high (1)) and the high signal (1) at the DETFALL node 223 and provides a logic high (1). In this manner, the third latch 244 provides a logic high (1) at the DETECTION node 128, indicating that the external capacitor 114 is coupled to the output of the LDO regulator 108.

The truth table 900 illustrates the signals at the DETRISE node 221, the DETFALL node 223, and the DETECTION node 128 for the third condition 906, when the external capacitor 114 is included in the system 100 with an initial charge that is less than the threshold voltage (Vth) of the first transistor 214. At the time the third flip-flop 244 is enabled (e.g., when the signal at the LATCHZ_DLY node 227 goes high), the signal at the DETRISE node 221 is logic low (0) and the signal at the DETFALL node 223 is logic low (0). The third logic gate 240 obtains the inverted signal at the DETRISE node 221 (e.g., a logic high (1)) and the low signal (0) at the DETFALL node 223 and provides a logic high (1). In this manner, the third latch 244 provides a logic high (1) at the DETECTION node 128, indicating that the external capacitor 114 is coupled to the output of the LDO regulator 108.

The truth table 900 illustrates the signals at the DETRISE node 221, the DETFALL node 223, and the DETECTION node 128 for the fourth condition 908, when the external capacitor 114 is included in the system 100 with an initial charge that is greater than the threshold voltage (Vth) of the first transistor 214. At the time the third flip-flip 244 is enabled (e.g., when the signal at the LATCHZ_DLY node 227 goes high), the signal at the DETRISE node 221 is logic high (1) and the signal at the DETFALL node 223 is logic high (1). The third logic gate 240 obtains the inverted signal at the DETRISE node 221 (e.g., a logic high (1)) and the low signal (0) at the DETFALL node 223 and provides a logic high (1). In this manner, the third latch 244 provides a logic high (1) at the DETECTION node 128, indicating that the external capacitor 114 is coupled to the output of the LDO regulator 108.

FIG. 10 is a schematic of an example first capacitor detection circuit 1000. The first capacitor detection circuit 1000 includes a first MOSFET 1002, a second MOSFET 1004, a large resistor 1006, and a comparator 1008. In some examples, the first capacitor detection circuit 1000 includes an external capacitor 1010.

In FIG. 10, the first MOSFET 1002 is a P-channel MOSFET and the second MOSFET 1004 is an N-channel MOSFET. The first MOSFET 1002 turns on when the gate-to-source voltage (Vgs) is greater than a threshold voltage of the first MOSFET 1002. The second MOSFET 1004 turns on when the Vgs of the is greater than the threshold voltage of the second MOSFET 1004.

The first capacitor detection circuit 1000 detects if a pin node 1012 is forced high, is forced low, or is floating. For example, the large resistor 1006 is coupled to the comparator 1008 and an output of an LDO regulator at the pin node 1012. The LDO regulator may be implemented in a similar fashion as the LDO regulator 108 of FIG. 1.

In an operation of the first capacitor detection circuit 1000, a clock signal 1014 is applied to a gate terminal of the first MOSFET 1002 and a gate terminal of the second MOSFET 1004. In some examples, the clock signal 1014 causes the first MOSFET 1002 to turn on and the second MOSFET 1004 to turn off and vice versa. For example, the first MOSFET 1002 turns off and the second MOSFET 1004 turns on responsive to the clock signal 1014 going high. In other examples, the first MOSFET 1002 turns on and the second MOSFET 1004 turns off responsive to the clock signal 1014 going low. In this manner, the signal at an output node 1016 goes high and low. For example, when the first MOSFET 1002 is on, the signal at the output node 1016 goes high and when the second MOSFET 1004 is on, the signal at the output node 1016 goes low.

In a condition where the external capacitor 1010 is not coupled to the pin node 1012, the output of the comparator 1008 toggles between high and low. For example, if the external capacitor 1010 is not present to oppose the changes in voltage of the signal at the output node 1016, the signal at the pin node 1012 follows the inverted clock signal 1014 and, thus, the output of the comparator 1008 toggles.

In a condition where the external capacitor 1010 is coupled to the pin node 1012, the output of the comparator 1008 is either always high or always low. For example, if the external capacitor 1010 is opposing the changes in voltage at the output node 1016, the signal at the pin node 1012 depends on how long the external capacitor 1010 takes to charge (e.g., how big the capacitor 1010 is), the frequency of the clock signal 1014, the resistance of the resistor 1006, the threshold of the comparator 1008, and a supply voltage supplied to the first MOSFET 1002 and the second MOSFET 1004.

The first capacitor detection circuit 1000 of FIG. 10 does not include an internal reference capacitor (e.g., such as the internal capacitor 224 of FIG. 2) and, thus, requires accurate clock signals 1014, an accurate comparator 1008, and a specific resistance of the resistor 1006 to operate accurately. The accuracy of the detector circuit 104 of FIGS. 1 and 2 is bounded by variations in the internal capacitor 224 which, in an IC fabrication process, is very well controlled to be of the order of +/−10% and also includes temperature stability. Further the accuracy of the detector circuit 104 only depends on the ratio of resistors (e.g., the first resistor 212 and the second resistor 222) which, when fabricated on an IC, can be very well matched to 0.1% accuracy. Further the capacitance of internal capacitor 224 can be trimmed (e.g., adjusted) using fuses or EEPROM (electrically erasable programmable read-only memory) during production test to generate a more precise level of accuracy (e.g., less than 1% accuracy) of the internal capacitor 224 in the application.

Figure 11:
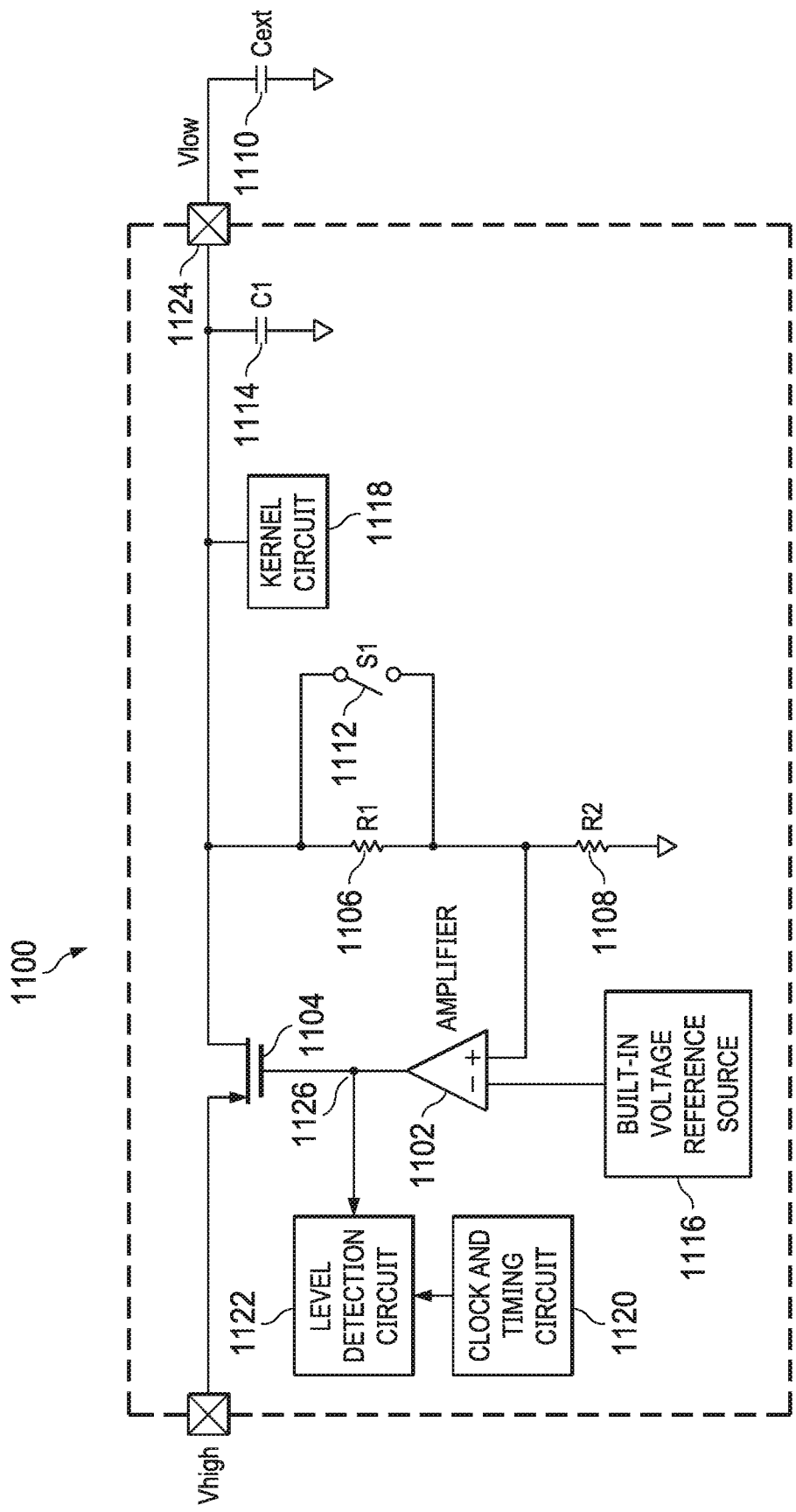
FIG. 11 is a schematic of an example low-dropout (LDO) regulator circuit including detection components to detect a capacitor.

FIG. 11 is a schematic of an example LDO circuit 1100. The LDO circuit 1100 includes an error amplifier 1102, a power FET 1104, a first feedback resistor 1106, a second feedback resistor 1108, an external capacitor 1110, a switch 1112, a minimum capacitor 1114, a reference source 1116, a kernel circuit 1118, a clock and timing circuit 1120, and a level detection circuit 1122.

The error amplifier 1102 is the error amplifier of the LDO circuit 1100. The error amplifier 1102 includes two input signals. The first input signal to the error amplifier 1102 is a reference signal from the reference source 1116. The second input signal to the error amplifier 1102 is a feedback signal from the first feedback resistor 1106 and the second feedback resistor 1108. The error amplifier 1102 includes an output signal coupled to a gate terminal of the power FET 1104.

The power FET 1104 regulates the signal at the output of the LDO circuit 1100 based on the output of the error amplifier 1102. The power FET 1104 charges the signal at the Vlow node 1124 responsive to the error amplifier 1102. The signal at the Vlow node 1124 charges at a rate that is dependent on the external capacitor 1110.

The switch 1112, the clock and timing circuit 1120, and the level detection circuit 1122 are implemented in the LDO circuit 1100 for the purpose of detecting the external capacitor 1110. For example, in an operation of the LDO circuit 1100, the detection of the external capacitor 1110 is initiated when the clock and timing circuit 1120 sends a control signal to the switch 1112. The switch 1112 shorts (e.g., turns on, enables, etc.) responsive to the control signal.

The clock and timing circuit 1120 turns on the switch 1112 and the voltage at the Vlow node 1124 is directly input to the positive terminal of the error amplifier 1102. The error amplifier 1102 provides a high level to turn off the power FET 1104, because the power FET 1104 is a P-channel MOSFET. The voltage at the Vlow node 1124 is discharged, responsive to turning off the power FET 1104. The second feedback resistor 1108 discharges the voltage at the Vlow node 1124 until the voltage at the Vlow node 1124 is equal to a reference voltage output by the reference source 1116 and until the output voltage of the error amplifier 1102 slows down (e.g., decreases, slows down to the original working voltage, etc.).

During the error amplifier 1102 recovery process (e.g., the process at which the output voltage of the error amplifier decreases), the level detecting circuit 1122 detects whether the error amplifier 1102 is always at a high level between settings (e.g., for a length of pre-determined time). If the level detecting circuit 1122 determines the error amplifier 1102 is at a high level between the setting, the level detecting circuit 1122 determines that the external capacitor 1110 has a normal capacitance and/or is otherwise connected to the output of the LDO circuit 1100. Otherwise, the level detecting circuit 1122 determines that the external capacitor 1110 is not connected or the capacitance is abnormal.

Example methods, apparatus and articles of manufacture described herein improve the accuracy of detecting external capacitors in systems implementing LDO regulators. Example methods, apparatus and articles of manufacture described herein improve the accuracy of detection by implementing an internal capacitor with a number of match components, such as matched resistors, matched comparators, and matched transistors that assist in generating and comparing two voltage ramps corresponding to the internal capacitor and the external capacitor.

Example methods, apparatus, systems, and articles of manufacture to improve detection of capacitors implemented for regulators are described herein such as the following.

Example 1 includes an apparatus comprising a resistor (212) having a resistor terminal, a capacitor (114) coupled to the resistor terminal, a transistor (214) having a current terminal and a gate, the gate coupled to the resistor terminal and coupled to the capacitor (114), a comparator (216) having a comparator input and a comparator output, the comparator input coupled to the current terminal, and a latch (232) having a latch input coupled to the comparator output.

Example 2 includes the apparatus of example 1, wherein the resistor (212) is a first resistor (212), the resistor terminal is a first resistor terminal, the capacitor (114) is a first capacitor (114), the transistor (214) is a first transistor (214), the current terminal is a first current terminal, the gate is a first gate, and the comparator (216) is a first comparator (216), the comparator input is a first comparator input, the comparator output is a first comparator output, the apparatus further including a second resistor (222) having a second resistor terminal, a second capacitor (224) coupled to the second resistor terminal, a second transistor (226) having a second current terminal and a second gate, the second gate coupled to the second resistor terminal and the second capacitor (224), and a second comparator (228) having a second comparator input and a second comparator output, the second comparator input coupled to the second current terminal.

Example 3 includes the apparatus of example 1, wherein the resistor (212) is a first resistor (212), the resistor terminal is a first resistor terminal, the capacitor (114) is a first capacitor (114), the transistor (214) is a first transistor (214), the current terminal is a first current terminal, the gate is a first gate, and the comparator (216) is a first comparator (216), the comparator input is a first comparator input, the comparator output is a first comparator output, the first resistor (212) includes a second resistor terminal and wherein the apparatus further includes a second resistor (222) having a third resistor terminal and a fourth resistor terminal, a second capacitor (224) coupled to the third resistor terminal, a second transistor (226) having a second current terminal and a second gate, the second gate coupled to the third resistor terminal and the second capacitor (224), a second comparator (228) having a second comparator input and a second comparator output, the second comparator input coupled to the second current terminal, a supply terminal (252), a first switch (208) having a first switch terminal and a second switch terminal, the first switch terminal coupled to the supply terminal (252) and the second switch terminal coupled to the second resistor terminal, a second switch (210) having a third switch terminal coupled to the second switch terminal and the second resistor terminal, a third switch (218) having a fourth switch terminal and a fifth switch terminal, the fourth switch terminal coupled to the supply terminal (252) and the fifth switch terminal coupled to the fourth resistor terminal, and a fourth switch (220) having a sixth switch terminal coupled to the fourth resistor terminal.

Example 4 includes the apparatus of example 3, wherein the first comparator (216) is an inverting Schmitt trigger and the second comparator (228) is a Schmitt trigger.

Example 5 includes the apparatus of example 1, wherein the transistor (214) is an N-channel metal-oxide-semiconductor field-effect transistors (MOSFETs).

Example 6 includes the apparatus of example 1, wherein the latch (232) is a first latch (232), the resistor (212) is a first resistor (212), the resistor terminal is a first resistor terminal, the capacitor (114) is a first capacitor (114), the transistor (214) is a first transistor (214), the current terminal is a first current terminal, the gate is a first gate, and the comparator (216) is a first comparator (216), the comparator input is a first comparator input, the comparator output is a first comparator output, the apparatus further includes a second resistor (222) having a third resistor terminal and a fourth resistor terminal, a second capacitor (224) coupled to the third resistor terminal, a second transistor (226) having a second current terminal and a second gate, the second gate coupled to the third resistor terminal and the second capacitor (224), a second comparator (228) having a second comparator input and a second comparator output, the second comparator input coupled to the second current terminal, the first latch (232) having a first data input, a first clock input, and a first latch output, the first data input coupled to the first comparator output, a second latch (234) having a second data input, a second clock input, and a second latch output, the second data input coupled to the first comparator output and the second clock input coupled to the second comparator output, and a first logic gate (230) having a first logic gate input and a first logic gate output, the first logic gate input coupled to the second comparator output and the first logic gate output coupled to the first clock input.

Example 7 includes the apparatus of example 6, wherein the apparatus includes a second logic gate (236) having a second logic gate input and a second logic gate output, the second logic gate input coupled to the first latch output, and a third logic gate (240) having a first logic input, a second logic input, and a third logic gate output, the first logic input coupled to the second logic gate output, the second logic input coupled to the second latch output.

Example 8 includes the apparatus of example 7, wherein the first logic gate (230) and the second logic gate (236) are inverter logic gates.

Example 9 includes the apparatus of example 7, wherein the third logic gate (240) is an OR logic gate.

Example 10 includes the apparatus of example 1, wherein the latch (232) is a first latch (232), the resistor (212) is a first resistor (212), the resistor terminal is a first resistor terminal, the capacitor (114) is a first capacitor (114), the transistor (214) is a first transistor (214), the current terminal is a first current terminal, the gate is a first gate, and the comparator (216) is a first comparator (216), the comparator input is a first comparator input, the comparator output is a first comparator output, the apparatus further includes a second resistor (222) having a third resistor terminal and a fourth resistor terminal, a second capacitor (224) coupled to the third resistor terminal, a second transistor (226) having a second current terminal and a second gate, the second gate coupled to the third resistor terminal and the second capacitor (224), a second comparator (228) having a second comparator input and a second comparator output, the second comparator input coupled to the second current terminal, a second latch (234) coupled to the first comparator output and the second comparator output, a first logic gate (230) coupled to the second comparator output and coupled to the first latch (232), a second logic gate (236) coupled to the first latch (232), a third logic gate (240), the third logic gate (240) coupled to the second logic gate (236) and coupled to the second latch (234), and a third latch (244) coupled to the third logic gate (240).

Example 11 includes the apparatus of example 10, wherein the first latch (232), the second latch (234), and the third latch (244) are D-type flip-flops.

Example 12 includes the apparatus of example 1, wherein the latch (232) is a first latch (232), the transistor (214) is a first transistor (214), the current terminal is a first current terminal, the gate is a first gate, and the comparator (216) is a first comparator (216), the comparator input is a first comparator input, the comparator output is a first comparator output, the apparatus further includes a second transistor (226) having a second current terminal, a second comparator (228) having a second comparator input and a second comparator output, the second comparator input coupled to the second current terminal, a delay logic (242) having a delay logic input and a delay logic output, the delay logic input coupled to the second comparator output, and a second latch (244) having a clock input coupled to the delay logic output.

Example 13 includes the apparatus of example 1, wherein the latch (232) is a first latch (232), the resistor (212) is a first resistor (212), the resistor terminal is a first resistor terminal, the capacitor (114) is a first capacitor (114), the transistor (214) is a first transistor (214), the current terminal is a first current terminal, the gate is a first gate, and the comparator (216) is a first comparator (216), the comparator input is a first comparator input, the comparator output is a first comparator output, the apparatus further includes a second resistor (222) having a third resistor terminal and a fourth resistor terminal, a second capacitor (224) coupled to the third resistor terminal, a second transistor (226) having a second current terminal and a second gate, the second gate coupled to the third resistor terminal and the second capacitor (224), a second comparator (228) having a second comparator input and a second comparator output, the second comparator input coupled to the second current terminal, the first latch (232) having a first data input, a first clock input, and a first latch output, the first data input coupled to the first comparator output, a second latch (234) having a second data input, a second clock input, and a second latch output, the second data input coupled to the first comparator output and the second clock input coupled to the second comparator output, a first logic gate (230) having a first logic gate input and a first logic gate output, the first logic gate input coupled to the second comparator output and the first logic gate output coupled to the first clock input, a second logic gate (236) having a second logic gate input and a second logic gate output, the second logic gate input coupled to the first latch output, a third logic gate (240) having a first logic input, a second logic input, and a third logic gate output, the first logic input coupled to the second logic gate output, the second logic input coupled to the second latch output, a delay logic (242) having a delay logic input and a delay logic output, the delay logic input coupled to the second comparator output, and a third latch (244) having a third data input and a third clock input, the third data input coupled to the third logic gate output and the third clock input coupled to the delay logic output.

Example 14 includes a system comprising a regulator (108) including a regulator output adapted to be coupled to a first capacitor (114), and a detector circuit (104) including a first transistor (214) having a first gate coupled to the regulator output and adapted to be coupled to the first capacitor (114), a second transistor (226) including a second gate adapted to be coupled to a second capacitor (224), and a latch (244) configured to latch a detection signal corresponding to a comparison between a first signal at the regulator output and a second signal at the second gate, the detection signal indicative of a status of the first capacitor (114).

Example 15 includes the system of example 14, wherein the system comprises a controller (102), the controller (102) includes a first controller output (116) coupled to an input, a second controller output (120) coupled to the detector circuit (104), and a controller input (126) coupled to an output of the latch (244).

Example 16 includes the system of example 15, wherein the detector circuit (104) comprises an enabler (250) coupled to the second controller output (120), the enabler (250) to initiate the detector circuit (104) to generate the detection signal based on a third signal at the second controller output (120).

Example 17 includes the system of example 14, wherein the regulator (108) is a low-dropout regulator adapted to be coupled to the first capacitor (114) externally.

Example 18 includes a method comprising applying a detection logic sequence to a detector circuit (104), generating a first voltage (VG1) responsive to the detection logic sequence at a first gate terminal of a first transistor (214), the first voltage (VG1) to ramp at a first voltage ramp rate dependent on a status of a first capacitor (114) and a first resistor (212) coupled to the first transistor (214), generating a second voltage (VG2) responsive to the detection logic sequence at a second gate terminal of a second transistor (226), the second voltage (VG2) to ramp at a second voltage ramp rate dependent on a size of a second capacitor (224) and a second resistor (222), the second capacitor (224) and the second resistor (222) coupled to the second transistor (226), comparing a speed of the first voltage ramp rate to a speed of the second voltage ramp rate, and determining the status of the first capacitor (114) based on the comparison.

Example 19 includes the method of example 18, wherein applying the detection logic sequence includes enabling a first switch (208) and a third switch (218) for a first period of time to generate the first voltage (VG1) and the second voltage (VG2), the first switch (208) coupled to the first resistor (212) and the third switch (218) coupled to the second resistor (222), disabling a second switch (210) and a fourth switch (220) for the first period of time concurrently to enabling the first switch (208) and the third switch (210) to generate the first voltage (VG1) and the second voltage (VG2), the second switch (210) coupled to the first resistor (212) and the fourth switch (220) coupled to the second resistor (222), responsive to the first period of time ending disabling the first switch (208) and the third switch (218), enabling the second switch (210) and the fourth switch (220) concurrently to disabling the first switch (208) and the third switch (218) to discharge the first voltage (VG1) through the second switch (210) and the first resistor (212) and to discharge the second voltage (VG2) through the fourth switch (220) and the second resistor (222), comparing a speed of a first discharge rate of the first voltage (VG1) to a speed of a second discharge rate of the second voltage (VG2), and determining the status of the first capacitor (114) based on the comparison.

Example 20 includes the method of example 18, further including providing a detection signal indicative of the status of the first capacitor (114) to a controller (102), the status corresponding to a connection of the first capacitor (114).

Example 21 includes the method of example 18, further including configuring the detector circuit (104) for detection of a valid range of the first capacitor (114) based on modifying values of the first resistor (212) and the second resistor (222).

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, unless otherwise stated, if two components or values are described as being "approximately" the same, "approximately" equal or "approximately" identical, then it means they are within +/−5 percent (±5%) of each other.

Modifications are possible in the described embodiments, and other embodiments are possible, within the scope of the claims.

What is claimed is:

1. An apparatus comprising:
a first resistor having first and second resistor terminals;
a second resistor having third and fourth resistor terminals;
a first capacitor coupled to the first resistor terminal;
a second capacitor coupled to the third resistor terminal;
a first transistor coupled between a first current source and a ground terminal and having a first control terminal, wherein the first control terminal is coupled to the first resistor terminal and the first capacitor;
a second transistor coupled between a second current source and the ground terminal and having a second control terminal, wherein the second control terminal is coupled to the third resistor terminal and the second capacitor;
a first comparator having a first comparator input and a first comparator output, wherein the first comparator input is coupled to the first transistor;
a second comparator having a second comparator input and a second comparator output, wherein the second comparator input is coupled to the second transistor; and
a latch having a latch input and a latch output, wherein the latch input is coupled to the first comparator output.

2. The apparatus of claim 1, wherein the apparatus further comprises:
a first switch having a first switch terminal and a second switch terminal, wherein the first switch terminal is coupled to a supply terminal, and the second switch terminal is coupled to the second resistor terminal;
a second switch having a third switch terminal, wherein the third switch terminal is coupled to the second switch terminal and the second resistor terminal;
a third switch having a fourth switch terminal and a fifth switch terminal, wherein the fourth switch terminal is coupled to the supply terminal, and the fifth switch terminal is coupled to the fourth resistor terminal; and
a fourth switch having a sixth switch terminal, wherein the sixth switch terminal is coupled to the fourth resistor terminal.

3. The apparatus of claim 2, wherein the first comparator is an inverting Schmitt trigger and the second comparator is a Schmitt trigger.

4. The apparatus of claim 1, wherein the first transistor is an N-channel field-effect transistor (NFET).

5. The apparatus of claim 1, wherein the latch is a first latch, the first latch further includes a first data input, a first clock input, and a first latch output, the first data input coupled to the first comparator output, and the apparatus further comprises:
a second latch having a second data input, a second clock input, and a second latch output, wherein the second data input is coupled to the first comparator output, and the second clock input is coupled to the second comparator output; and
a logic gate having a first logic gate input and a first logic gate output, wherein the first logic gate input is coupled to the second comparator output, and the first logic gate output is coupled to the first clock input.

6. The apparatus of claim 5, wherein the logic gate is a first logic gate, and the apparatus includes:
a second logic gate having a second logic gate input and a second logic gate output, wherein the second logic gate input is coupled to the first latch output; and
a third logic gate having third and fourth logic gate inputs and a third logic gate output, wherein the third logic gate input is coupled to the second logic gate output, and the fourth logic gate input is coupled to the second latch output.

7. The apparatus of claim 6, wherein the first logic gate and the second logic gate are inverter logic gates.

8. The apparatus of claim 6, wherein the third logic gate is an OR logic gate.

9. The apparatus of claim 1, wherein the latch is a first latch, and the apparatus further comprises:
a second latch coupled to the first comparator output and the second comparator output;
a first logic gate coupled to the second comparator output and coupled to the first latch;
a second logic gate coupled to the first latch;
a third logic gate, the third logic gate coupled to the second logic gate and coupled to the second latch; and
a third latch coupled to the third logic gate.

10. The apparatus of claim 9, wherein the first latch, the second latch, and the third latch are D-type flip-flops.

11. The apparatus of claim 1, wherein the latch is a first latch, and the apparatus further comprises:
a delay logic having a delay logic input and a delay logic output, wherein the delay logic input is coupled to the second comparator output; and
a second latch having a clock input coupled to the delay logic output.

12. The apparatus of claim 1, wherein the latch is a first latch, the first latch has a first data input, a first clock input, and a first latch output, the first data input coupled to the first comparator output, and the apparatus further comprises:

- a second latch having a second data input, a second clock input, and a second latch output, wherein the second data input is coupled to the first comparator output, and the second clock input is coupled to the second comparator output;
- a first logic gate having a first logic gate input and a first logic gate output, wherein the first logic gate input is coupled to the second comparator output, and the first logic gate output is coupled to the first clock input;
- a second logic gate having a second logic gate input and a second logic gate output, wherein the second logic gate input is coupled to the first latch output;
- a third logic gate having a first logic input, a second logic input, and a third logic gate output, wherein the first logic input is coupled to the second logic gate output, and the second logic input is coupled to the second latch output;
- a delay logic having a delay logic input and a delay logic output, wherein the delay logic input is coupled to the second comparator output; and
- a third latch having a third data input and a third clock input, wherein the third data input is coupled to the third logic gate output, and the third clock input is coupled to the delay logic output.

13. A system comprising:
a regulator having a regulator output coupled to a first capacitor; and
a detector circuit including:
- a first transistor having a first gate coupled to the regulator output and to the first capacitor;
- a second transistor having a second gate coupled to a second capacitor; and
- a latch configured to latch a detection signal corresponding to a comparison between a first signal at the regulator output and a second signal at the second gate, wherein the detection signal is indicative of a status of the first capacitor.

14. The system of claim 13, wherein the system further comprises a controller, the controller including:
a first controller output coupled to an input;
a second controller output coupled to the detector circuit; and
a controller input terminal coupled to an output of the latch.

15. The system of claim 14, wherein the detector circuit includes an enabler coupled to the second controller output, wherein the enabler is configured to initiate the detector circuit to provide the detection signal responsive to a third signal at the second controller output.

16. The system of claim 13, wherein the regulator is a low-dropout regulator coupled to the first capacitor externally.

17. A method comprising:
applying a detection logic sequence to a detector circuit;
generating a first voltage responsive to the detection logic sequence at a first gate terminal of a first transistor, the first voltage to ramp at a first voltage ramp rate dependent on a status of a first capacitor and a first resistor coupled to the first transistor;
generating a second voltage responsive to the detection logic sequence at a second gate terminal of a second transistor, the second voltage to ramp at a second voltage ramp rate dependent on a size of a second capacitor and a second resistor, the second capacitor and the second resistor coupled to the second transistor;
comparing a speed of the first voltage ramp rate to a speed of the second voltage ramp rate; and
determining the status of the first capacitor based on the comparison.

18. The method of claim 17, wherein applying the detection logic sequence includes:
enabling a first switch and a third switch for a first period of time to generate the first voltage and the second voltage, the first switch coupled to the first resistor and the third switch coupled to the second resistor;
disabling a second switch and a fourth switch for the first period of time concurrently to enabling the first switch and the third switch to generate the first voltage and the second voltage, the second switch coupled to the first resistor and the fourth switch coupled to the second resistor;
responsive to the first period of time ending:
disabling the first switch and the third switch;
enabling the second switch and the fourth switch concurrently to disabling the first switch and the third switch to discharge the first voltage through the second switch and the first resistor and to discharge the second voltage through the fourth switch and the second resistor;
comparing a speed of a first discharge rate of the first voltage to a speed of a second discharge rate of the second voltage; and
determining the status of the first capacitor based on the comparison.

19. The method of claim 17, further comprising providing a detection signal indicative of the status of the first capacitor to a controller, the status corresponding to a connection of the first capacitor.

20. The method of claim 17, further comprising configuring the detector circuit for detection of a valid range of the first capacitor based on modifying values of the first resistor and the second resistor.

* * * * *